United States Patent
Feyh et al.

(10) Patent No.: US 10,351,420 B2
(45) Date of Patent: Jul. 16, 2019

(54) MEMBRANE FOR A CAPACITIVE MEMS PRESSURE SENSOR AND METHOD OF FORMING A CAPACITIVE MEMS PRESSURE SENSOR

(71) Applicant: Robert Bosch GmbH, Stuttgart (DE)

(72) Inventors: Ando Feyh, Reutlingen (DE); Gary O'Brien, Palo Alto, CA (US)

(73) Assignee: Robert Bosch GmbH, Stuttgart (DE)

( * ) Notice: Subject to any disclaimer, the term of this patent is extended or adjusted under 35 U.S.C. 154(b) by 15 days.

(21) Appl. No.: 15/536,088

(22) PCT Filed: Dec. 16, 2015

(86) PCT No.: PCT/US2015/066053
§ 371 (c)(1),
(2) Date: Jun. 14, 2017

(87) PCT Pub. No.: WO2016/100487
PCT Pub. Date: Jun. 23, 2016

(65) Prior Publication Data
US 2018/0327257 A1    Nov. 15, 2018

Related U.S. Application Data

(60) Provisional application No. 62/093,385, filed on Dec. 17, 2014.

(51) Int. Cl.
*B81B 7/02*       (2006.01)
*G01L 9/00*       (2006.01)
(Continued)

(52) U.S. Cl.
CPC ............... *B81B 7/02* (2013.01); *B81B 3/007* (2013.01); *B81B 3/0072* (2013.01);
(Continued)

(58) Field of Classification Search
CPC ......... B81B 3/007; B81B 3/0072; B81B 7/02; B81B 2201/0221; B81B 2201/0264; B81C 1/00261; G01L 9/0042; G01L 9/0073

See application file for complete search history.

(56) References Cited

U.S. PATENT DOCUMENTS 5,277,068 A    1/1994  Fukiura et al.
8,618,620 B2 * 12/2013 Winkler ............... G01L 9/0054
                                                        257/415
(Continued)

FOREIGN PATENT DOCUMENTS

EP    1 860 417 A2    11/2007
JP    2004-294158 A   10/2004

OTHER PUBLICATIONS

International Search Report corresponding to PCT Application No. PCT/US2015/066053, dated Feb. 26, 2016 (3 pages).
(Continued)

*Primary Examiner* — Andrew Q Tran
(74) *Attorney, Agent, or Firm* — Maginot Moore & Beck LLP

(57) ABSTRACT

A capacitive micro electrical mechanical system (MEMS) pressure sensor in one embodiment includes a base layer, a lower oxide layer supported by the base layer, a contact layer extending within the lower oxide layer, a membrane layer positioned generally above the lower oxide layer, the membrane layer including at least one protrusion extending downwardly through a portion of the lower oxide layer and contacting the contact layer, a nitride layer extending partially over the membrane layer, an upper oxide layer above the nitride layer, a backplate layer directly supported by the membrane layer and positioned above the upper oxide layer, a front-side etched portion exposing a first portion of the membrane layer through the upper oxide layer and the
(Continued)

nitride layer, and a backside etched portion extending through the base layer, the backside etched portion at least partially aligned with the front-side etched portion.

20 Claims, 36 Drawing Sheets

(51) Int. Cl.
*B81B 3/00* (2006.01)
*B81C 1/00* (2006.01)

(52) U.S. Cl.
CPC ........ *B81C 1/00261* (2013.01); *G01L 9/0042* (2013.01); *G01L 9/0073* (2013.01); *B81B 2201/0264* (2013.01); *B81B 2203/0127* (2013.01); *B81B 2207/115* (2013.01)

(56) References Cited

U.S. PATENT DOCUMENTS

| | | |
|---|---|---|
| 9,340,412 B2 * | 5/2016 | Besling .............. B81C 1/00158 |
| 2008/0210012 A1 | 9/2008 | Silverbrook et al. |
| 2013/0161702 A1 | 6/2013 | Chen |
| 2013/0283912 A1 | 10/2013 | Lin |

OTHER PUBLICATIONS

Supplementary European Search Report corresponding to European Patent Application No. 15 87 0969 (4 pages).

* cited by examiner

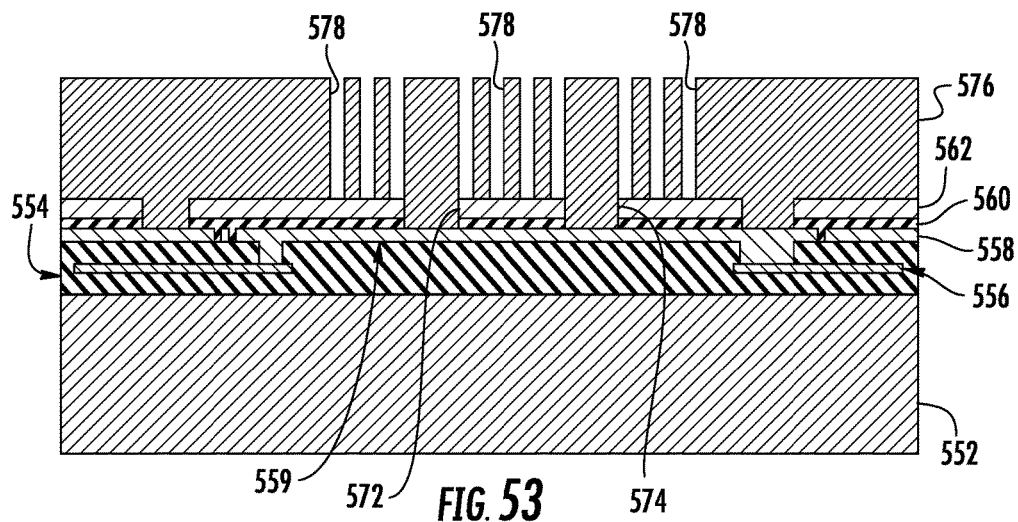
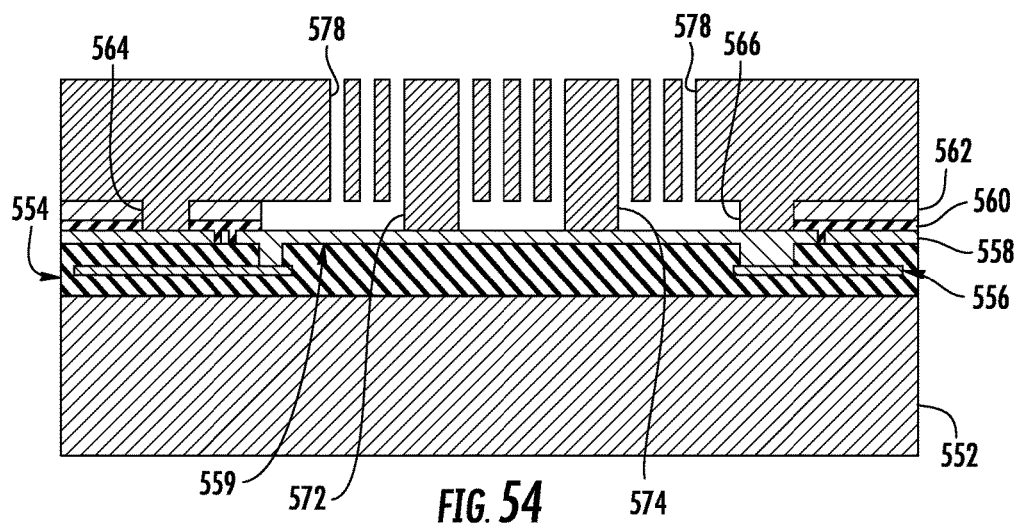

MEMBRANE FOR A CAPACITIVE MEMS PRESSURE SENSOR AND METHOD OF FORMING A CAPACITIVE MEMS PRESSURE SENSOR

This application is a 35 U.S.C. § 371 National Stage Application of PCT/US2015/066053, filed on Dec. 16, 2015, which claims the benefit of priority to U.S. provisional application Ser. No. 62/093,385, filed on Dec. 17, 2014, the disclosures of which are herein incorporated by reference in their entirety.

FIELD

The present disclosure relates to capacitive micro electrical mechanical system (MEMS) devices.

BACKGROUND

A capacitive MEMS pressure sensor requires two electrodes that move relative to each other under an applied pressure. This configuration is most often accomplished by having a fixed electrode formed in a substrate while a moveable electrode is provided in a deformable membrane which is exposed to the pressure that is to be sensed. One or more of the electrodes are typically formed by deposition of a conductive film, electrical isolation of a conductive layer, or by simply adding a spacer layer between two conductive materials.

The formation of the moveable electrode in the deformable membrane involves a number of operational considerations such as the clamping of the membrane to set the deflection area, the impact of external stresses on membrane deflection, the impact of parasitic capacities on the membrane, the susceptibility of the membrane and clamping features to gas diffusion, and the impact of membrane over-travel on pressure sensor reliability.

A pressure sensor with a membrane configuration that accounts for the above-mentioned operational considerations is, therefore, desirable. A process for forming a pressure sensor that addresses these operational considerations is further desirable.

SUMMARY

In accordance with one embodiment, a capacitive micro electrical mechanical system (MEMS) pressure sensor includes a base layer, a lower oxide layer supported by the base layer, a contact layer extending within the lower oxide layer, a membrane layer positioned generally above the lower oxide layer, the membrane layer including at least one protrusion extending downwardly through a portion of the lower oxide layer and contacting the contact layer, a nitride layer extending partially over the membrane layer, an upper oxide layer above the nitride layer, a backplate layer directly supported by the membrane layer and positioned above the upper oxide layer, a front-side etched portion exposing a first portion of the membrane layer through the upper oxide layer and the nitride layer, and a backside etched portion extending through the base layer, the backside etched portion at least partially aligned with the front-side etched portion.

In one or more embodiments, a sensor includes at least one nitride portion extending downwardly from the nitride layer through the membrane layer to the lower oxide layer, the at least one nitride portion enclosing the first portion of the membrane layer and the second portion of the membrane layer.

In one or more embodiments, the contact layer includes a shield portion which extends along a lower surface of the lower oxide portion at a location directly between the aligned backside etched portion and front-side etched portion, the shield portion contacting the base layer.

In one or more embodiments, the backside etched portion extends through the lower oxide layer exposing a second portion of the membrane layer.

In one or more embodiments, the contact layer extends outwardly away from the backside etched portion from the location at which the at least one protrusion contacts the contact layer to a location outwardly of a location directly beneath a first of the at least one nitride portions.

In one or more embodiments, a sensor includes at least one clamp portion extending downwardly from the backplate layer and contacting the membrane layer at a location directly above an outward area of the second portion of the membrane layer thereby clamping the membrane layer.

In one or more embodiments, a sensor includes at least one boss supported by the membrane layer and encircled at one location by the front-side etched portion and encircled at another location by the backplate layer, wherein the at least one boss portion is formed out of the backplate layer.

In one or more embodiments, a sensor includes at least one boss extending downwardly from the membrane layer within the backside etched portion, the at least one boss including a sidewall formed with the membrane layer encircling a portion of the lower oxide layer, and a bottom portion encapsulating the portion of the lower oxide layer, the bottom portion formed from the contact layer.

In one or more embodiments, a sensor includes at least one corrugation extending downwardly from the membrane layer within the backside etched portion, the at least one corrugation encircling a portion of the membrane layer and including spaced apart sidewalls formed with the membrane layer and a bottom portion formed with the membrane layer, the bottom portion further including a planar corrugation cap on a lower surface of the bottom portion and formed from the contact layer.

In one or more embodiments, a sensor includes at least one sealed perforated structure including a cavity defined by a pair of opposed spaced apart sidewalls integrally formed with and extending downwardly from the membrane layer within the backside etched portion, a bottom portion formed from the contact layer, and at least one sealed etched portion of the membrane layer.

In one or more embodiments, a sensor includes a dimple portion of the backplate layer, wherein, the backplate layer directly above the first portion of the membrane layer generally defines a first plane, and the dimple portion is directly above the first portion of the membrane layer and extends downwardly below the first plane.

In one or more embodiments, the dimple portion is electronically isolated from other portions of the backplate layer.

In one or more embodiments, the dimple portion is in electrical communication with the first portion of the membrane layer.

In one or more embodiments, a sensor includes an over-travel stop, the over-travel stop formed integrally with the membrane layer, aligned with the dimple portion, and extending upwardly from a plane generally defined by the membrane layer toward the dimple portion.

In one embodiment, a method of forming a capacitive micro electrical mechanical system (MEMS) pressure sensor includes forming a plurality of first contact layer portions on an first oxide layer portion supported by a base layer, encapsulating the plurality of first contact layer portions with the first oxide portion and a second oxide portion, etching the second oxide portion to expose a plurality of second contact layer portions of the plurality of first contact layer portions, forming a membrane layer on the plurality of second contact layer portions and on an upper surface of the second oxide portion, forming a nitride layer on an upper surface of the membrane layer, forming an upper oxide layer on an upper surface of the nitride layer, etching a first portion of the nitride layer and a first portion of the upper oxide layer to expose a first portion of the membrane layer, forming a backplate layer on the first portion of the membrane layer, front-side etching a second portion of the nitride layer and a second portion of the upper oxide layer through the backplate layer to expose a second portion of the membrane layer, and backside etching the base layer to form a cavity at least partially aligned with the second portion of the membrane layer.

In one or more embodiments, the plurality of second contact layer portions are located closer to the cavity than a third contact layer portion of the first contact layer portions.

In one or more embodiments, backside etching the base layer includes backside etching the base layer such that a horizontally extending portion of at least one of the plurality of first contact layer portions is exposed.

In one or more embodiments, forming the membrane layer includes forming a pair of downwardly extending sidewalls such that when the base layer is backside etched, the pair of downwardly extending sidewalls extend into the cavity.

In one or more embodiments, a method of forming a capacitive MEMS pressure sensor includes forming a bottom portion of a protrusion extending between the downwardly extending sidewalls and on one of the plurality of second contact layer portions.

In one or more embodiments, forming the backplate layer includes forming a dimple portion extending downwardly below a plane generally defined by a portion of the membrane layer, the dimple portion directly above the first portion of the membrane layer, the method further including electronically isolating the dimple portion from other portions of the backplate layer, and placing the dimple portion in electronic communication with the first portion of the membrane layer.

BRIEF DESCRIPTION OF THE DRAWINGS

FIGS. 51-54 depict a modification of the process of FIGS. 23-33 for forming the pressure sensor of FIG. 5;

DESCRIPTION

Figure 1:
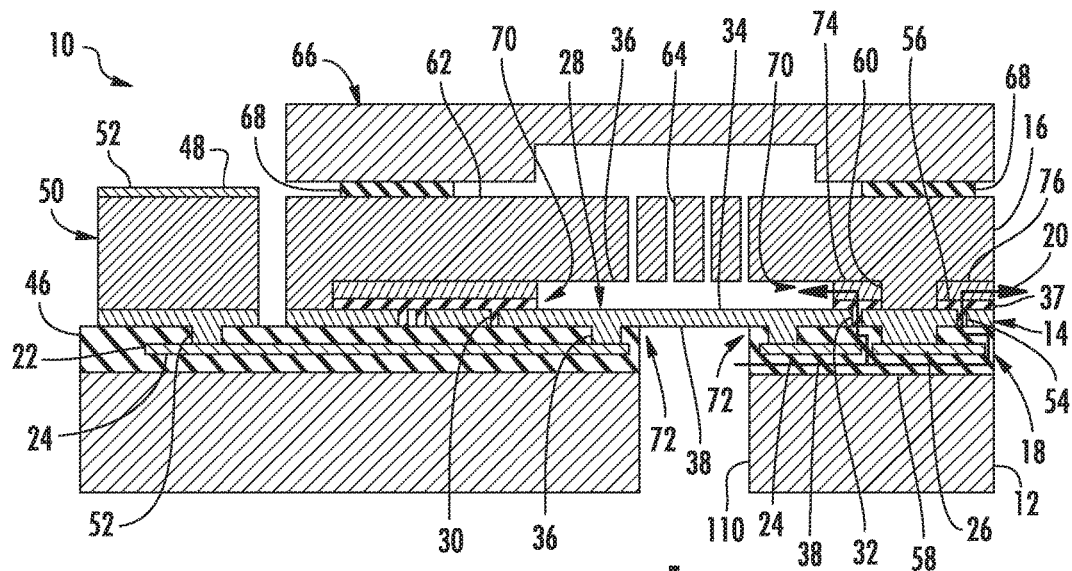
FIG. 1 depicts a side cross-sectional view of a pressure sensor with a flexible membrane according to one embodiment.

For the purpose of promoting an understanding of the principles of the disclosure, reference will now be made to the embodiments illustrated in the drawings and described in the following written specification. It is understood that no limitation to the scope of the disclosure is thereby intended. It is further understood that the disclosure includes any alterations and modifications to the illustrated embodiments and includes further applications of the principles of the disclosure as would normally occur to one skilled in the art to which this disclosure pertains.

FIG. 1 depicts a side cross-sectional view of a MEMS pressure sensor 10 according to one embodiment. The pressure sensor 10 includes a base layer 12, a flexible device layer 14, and a solid backplate layer 16. A lower oxide layer 18 separates the base layer 12 from the membrane layer, and an upper oxide layer 20 separates the membrane layer 14 from the backplate layer 16.

A contact layer 22 is disposed within the lower oxide layer 18. The contact layer 22 is segmented and forms plurality of electrically conductive paths through the lower oxide layer 18. In the embodiment shown, the contact layer 22 includes a membrane path 24 and a backplate path 26. The conductive paths 24 and 26 extend laterally along the contact layer 22 within the lower oxide layer 18.

Within the device layer 14, a membrane 28 is defined by two laterally spaced nitride spacers 30 and 32. An upper surface 34 of the membrane 28 is isolated from the backplate layer 16 by an etched portion 36 of both the upper oxide layer 20 and a nitride layer 37 disposed below the upper oxide layer 20. A lower surface 38 of the membrane 28 is exposed to the environment by a backside etched portion 40 that extends through the base layer 12 and the lower oxide layer 18. The membrane 28 includes two protrusions 42 and 44 that extend through an upper portion 46 of the lower oxide layer 18 and contact the membrane path 24 for electrical communication therebetween.

The membrane 28 is clamped between upper clamp portions 70 at the upper surface 34 and lower clamp portions 72 at the lower surface 38. The upper clamp portions 70 in the embodiment shown include portions of the upper oxide layer 20 and the nitride layer 37 that extend laterally from the spacers 30 and 32. The lower clamp portions 72 include portions of the upper portion 46 of the lower oxide layer 18 that extend laterally from the protrusions 36 and 38.

An etched portion 48 of the backplate layer 16 isolates a bond member 50 from the device layer 14 and the backplate layer 16. The bond member 50 has a protrusion 52 that extends through the upper portion 46 of the lower oxide 18 and contacts the membrane path 24 for electrical communication therebetween. The membrane protrusions 42 and 44, the bond member protrusion 52, and the membrane path 24 enable electrical communication between the bond member 50 and the membrane 28. In the embodiment shown, the bond member 50 includes a bond pad 52 disposed above the bond member 50. The bond pad 52 is configured for electrical connection to other electrical components or devices.

The spacer 32 and an additional laterally spaced nitride spacer 54 electrically isolate a connector 56 in the device layer 14 from the rest of the device layer 14. The connector 56 has a protrusion 58 that extends through the upper portion 46 of the lower oxide layer 18 and contacts the backplate path 26 for electrical communication therebetween.

The backplate layer 16 includes a protrusion 60 that extends through the upper oxide layer 20 and the nitride layer 37 and contacts the connector 56. The protrusion 60, the connector 56, and the backplate path 26 enable electrical communication between the backplate layer 16 and a further bond member (not shown) of the pressure sensor 10. The backplate layer 16 also includes a plurality of vent holes or perforations 64 that extend through the backplate layer 16 in a region of the backplate layer 16 disposed above to the etched portion 36.

A cap wafer or application specific integrated circuit (ASIC) wafer 66 is disposed above the backplate layer 16. The cap wafer 66 is hermetically sealed to the backplate layer 66 using a bond material 68 in a manner that encapsulates low pressure between the cap wafer 66 and the membrane 28.

In some instances, a pressure differential between a pressure within the backside etched portion 40 and a pressure within the etched upper oxide portion 36 or the ambient pressure outside of the pressure sensor 10 forms gas diffusion paths within the pressure sensor 10. In the embodiment of FIG. 1, a diffusion path (arrow 74) is shown originating in the backside etched portion 40, passing through the lower oxide layer 18 between the membrane path 24 and the backplate path 26, passing through the device layer 14 through the spacer 38, and discharging into the upper oxide etched portion 36. A diffusion path (arrow 76) is shown originating in the backside etched portion 40, passing through the lower oxide layer 18 and around the backplate path 26, passing through the device layer 14 through the spacer 54, passing through the upper oxide layer 20, and discharging outside of the pressure sensor 10.

Figure 2:
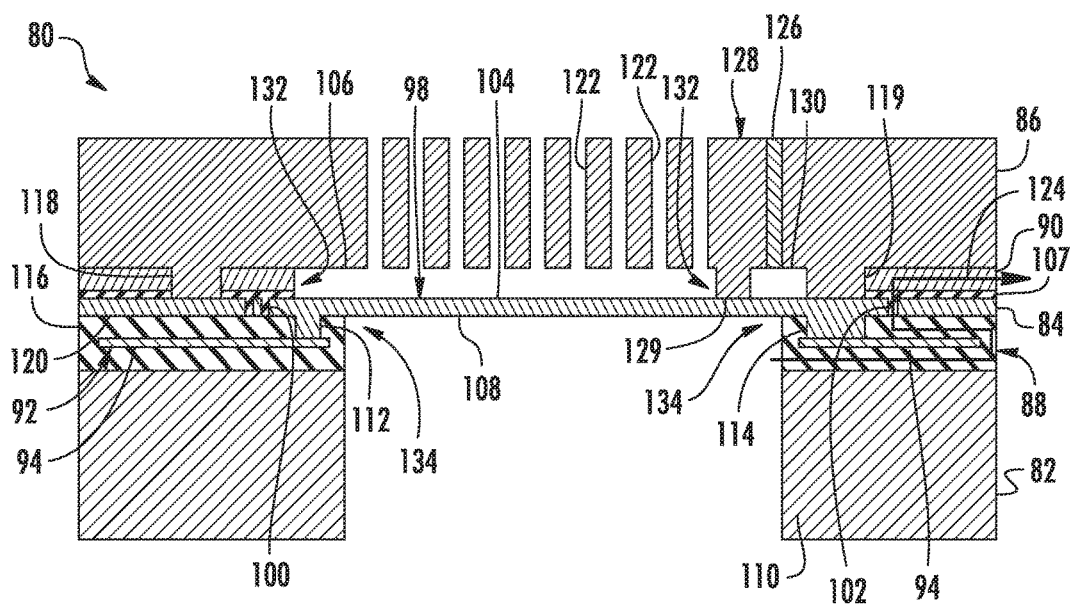
FIG. 2 shows a side cross-sectional view of a pressure sensor with a flexible membrane according to another embodiment.

FIG. 2 shows a side cross-sectional view of a MEMS pressure sensor 80 according to another embodiment. The pressure sensor 80 includes a base layer 82, a flexible device layer 84, and a solid backplate layer 86. A lower oxide layer 88 separates the base layer 82 from the membrane layer, and an upper oxide layer 90 separates the membrane layer 84 from the backplate layer 86.

A contact layer 92 is disposed within the lower oxide layer 88. The contact layer 22 forms an electrically conductive membrane path 94 through the lower oxide layer 88. The membrane path 94 extends laterally along the contact layer 92 within the lower oxide layer 88.

A membrane 98 is defined within the device layer 84 by two laterally spaced nitride spacers 100 and 102. An upper surface 104 of the membrane 98 is isolated from the backplate layer 86 by an etched portion 106 of both the upper oxide layer 90 and a nitride layer 107 disposed below the upper oxide layer 90. A lower surface 108 of the membrane 98 is exposed to the environment by a backside etched portion 110 that extends through the base layer 82 and the lower oxide layer 88. The membrane 98 includes two protrusions 112 and 114 that extend through an upper portion 116 of the lower oxide layer 88 and contact the membrane path 94 for electrical communication therebetween. The membrane protrusions 112 and 114 and the membrane path 94 enable electrical communication between the membrane 98 and components external to the pressure sensor 80. In some embodiments, the membrane path 94 leads to a bond member (e.g., bond member 50 in FIG. 1) formed in the backplate layer 86.

The backplate layer 86 includes two protrusions 118 and 119 that extend through the upper oxide layer 90 and the nitride layer 107. The protrusion 118 contacts a portion 120 of the device layer 84 located laterally outward from the spacer 100. The protrusion 118 and the device layer portion 120 enable electrical communication between the backplate layer 86 and other electrical components or devices. In some embodiments, a bond member (not shown) is formed in the backplate layer 86 to provide external connection to the backplate layer 86 via the device layer portion 120. The protrusion 119 contacts the upper surface 104 of the membrane 98 and is disposed above the protrusion 114 of the membrane 98. The backplate layer 86 also includes a plurality of vent holes or perforations 122 that extend through the backplate layer 86 in a region of the backplate layer 86 disposed above to the etched portion 106.

In some embodiments, a cap wafer or ASIC wafer (not shown), such as the cap wafer 66 of FIG. 1, is disposed above the backplate layer 86 to encapsulate low pressure between the cap wafer and the membrane 98. In some instances, a pressure differential between a pressure within the backside etched portion 110 and the ambient pressure outside of the pressure sensor 80 forms a gas diffusion path within the pressure sensor 80. In the embodiment of FIG. 2, a diffusion path (arrow 124) is shown originating in the backside etched portion 110, passing through lower oxide layer 88 and around the membrane path 94, passing through the device layer 84 through the spacer 102, passing through the upper oxide layer 90, and discharging outside of the pressure sensor 80.

As shown by comparing FIGS. 1 and 2, the diffusion path 74 of the pressure sensor 10 (FIG. 1) is not present in the pressure sensor 80 (FIG. 2). In addition, the contact layer 92 of the pressure sensor 80 (FIG. 2) is configured to increase the length of the diffusion path 124 as compared to the length of the diffusion path 76 of the pressure sensor 10 (FIG. 1). The extended length of the diffusion path 124 mitigates leakage through the pressure sensor 80 by further obstructing gas diffusion through the oxide layers 88 and 90 of the pressure sensor 80. In the embodiment shown, a portion of the contact layer 92 forms a toroidal boundary peripherally around a perimeter of the membrane 98 as viewed by perpendicularly projecting the membrane onto the contact layer 92.

With reference again to FIG. 2, a spacer 126 within the backplate layer 86 isolates a backplate clamp 128 from the backplate layer 86. The backplate clamp 128 has a protrusion 129 that contacts the upper surface 104 of the membrane 98. The backplate clamp 128 on one side forms a lateral boundary of the etched portion 106. The backplate clamp 128 on the other side along with the spacer 126, the backplate layer 86, and the protrusion 119 define a cavity 130 disposed above the device layer 84.

The membrane 98 is clamped between upper clamp portions 132 at the upper surface 104 and lower clamp portions 134 at the lower surface 108. The left-most upper clamp portion as viewed in the figure includes portions of the upper oxide layer 90 and the nitride layer 107, while the right-most upper clamp portion as viewed in the figure includes the backplate clamp 128. The lower clamp portions 134 include portions of the lower oxide layer 88 that extend laterally inward from the protrusions 112 and 114. The deflection area of the membrane 98 is set between the left-most lower clamp portion 134 as viewed in the figure and the backplate clamp 128. Since the portion of the membrane 98 between the backplate clamp 128 and the right-most lower clamp portion does not affect the deflection area, any deflection within this portion of the membrane 98 due to external stresses on the pressure sensor 80 does not impact sensor performance.

In embodiments that do not incorporate the above-described backplate clamp 128, the right-most upper clamp portion 133 as viewed in FIG. 2 includes the protrusion 119. The deflection area of the membrane 98 in these embodiments is set between the lower clamp portions 132, which include the portions of the lower oxide layer 88 as described above.

FIGS. 3-8 depict a number of variants of the pressure sensor 80 of FIG. 2. In the following description, elements shown in FIGS. 3-8 that are substantially similar to elements described above with reference to the pressure sensor 80 of FIG. 2 are denoted with like reference numerals. In contrast, elements depicted in FIGS. 3-8 that are new or substantially modified are denoted with unique reference numerals. The backplate clamp (128 in FIG. 2) has been omitted in each of FIGS. 3-8 for simplicity, so the protrusion (119 in FIG. 2) forms the right-most upper clamp portion of the membrane in the below-described embodiments.

Figure 3:
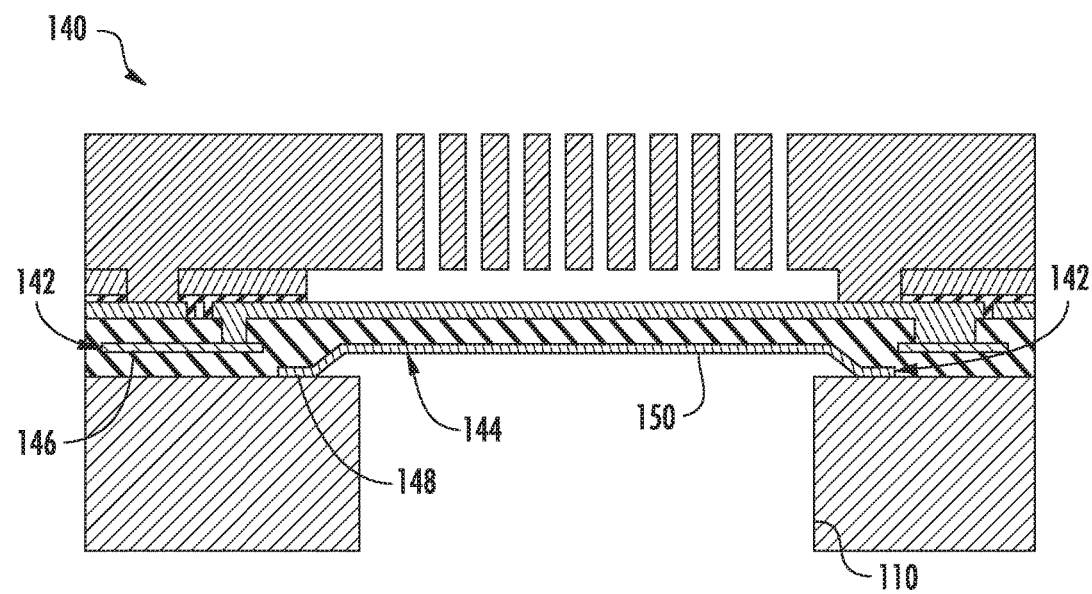
FIG. 3 shows a side-cross-sectional view of a pressure sensor with a flexible membrane ground-shielded by a contact layer.

FIG. 3 shows a pressure sensor 140 according to another embodiment. The pressure sensor 140 includes a base layer 82, a flexible device layer 84, and a solid backplate layer 86. A lower oxide layer 88 separates the base layer 82 from the membrane layer, and an upper oxide layer 90 separates the membrane layer 84 from the backplate layer 86.

The pressure sensor 140 includes a contact layer 142 disposed above the base layer 82. The contact layer 142 is segmented and forms at least one electrically conducive path through the lower oxide layer 88. In the embodiment shown, the contact layer 142 forms a shield portion which includes an inverted-cup-shaped central portion 144 and a planar peripheral portion 146 spaced laterally outward from the central portion 144. The central portion 144 adjoins the base layer 82 along a planar lip region 148. A planar base region 150 of the central portion 144 is offset from the lip region 148 in the direction of the lower oxide layer 88. The shield provides increased protection against gas diffusion.

A membrane 98 is defined within the device layer 84 by two laterally spaced nitride spacers 100 and 102. The membrane 98 includes two protrusions 112 and 114 that extend through an upper portion 116 of the lower oxide layer 88 and contact the peripheral portion 146 for electrical communication therebetween. The membrane protrusions 112 and 114 and the peripheral portion 146 enable electrical communication between the membrane 98 and components external to the pressure sensor 140. In some embodiments, the peripheral portion 146 leads to a bond member (e.g., bond member 50 in FIG. 1) formed in the backplate layer 86.

An upper surface 104 of the membrane 98 is isolated from the backplate layer 86 by an etched portion 106 of both the upper oxide layer 90 and a nitride layer 107 disposed below the upper oxide layer 90. A lower surface 108 of the membrane 98 substantially adjoins the lower oxide layer 88 between the protrusions 112 and 114. A backside etched portion 110 extends through the base layer 82 and a portion of the lower oxide layer 88 and exposes a lower surface 148 of the central portion 144 of the contact layer 142.

The backplate layer 86 includes two protrusions 118 and 119 that extend through the upper oxide layer 90 and the nitride layer 107. The protrusion 118 contacts a portion 120 of the device layer 84 located laterally outward from the spacer 100. The protrusion 118 and the device layer portion 120 enable electrical communication between the backplate layer 86 and other electrical components or devices. In some embodiments, a bond member (not shown) is formed in the backplate layer 86 to provide external connection to the backplate layer 86 via the device layer portion 120. The protrusion 119 contacts the upper surface 104 of the membrane 98 and is disposed above and laterally offset from the protrusion 114 of the membrane 98. The backplate layer 86 also includes a plurality of vent holes or perforations 122 that extend through the backplate layer 86 in a region of the backplate layer 86 disposed above to the etched portion 106.

The central portion 144 of the contact layer 142 as depicted in FIG. 3 has a lateral extent that is greater than the lateral extent of the membrane 98 such that the central portion 144 functions as a ground shield for the membrane. Any parasitic capacitances between the contact layer 142 and the membrane 98 are ground referenced and have limited impact on the performance of the pressure sensor 140. The attachment of the central portion 144 to the base layer 82 also functions to substantially eliminate gas diffusion through the pressure sensor 140.

Figure 4:
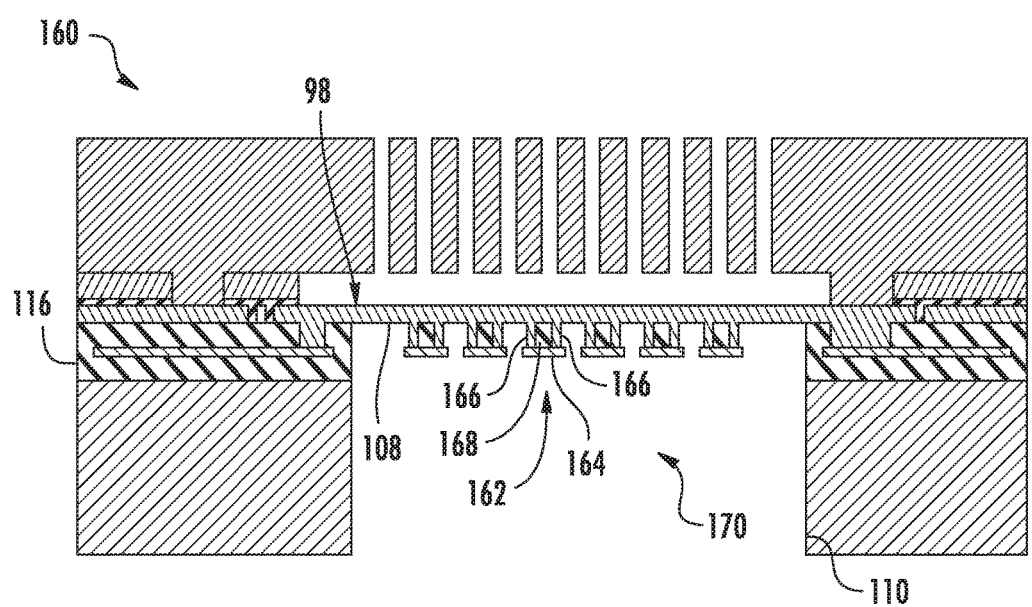
FIG. 4 depicts the pressure sensor of FIG. 2 with the membrane incorporating a plurality of boss structures on a lower surface.

FIG. 4 shows a pressure sensor 160 according to another embodiment. The pressure sensor 160 is similar to the pressure sensor 80 (FIG. 2) except that the membrane 98 includes at least one boss structure 162 that extends away from the lower surface 108 of the membrane 98. In addition to defining the membrane path 94, the contact layer 92 further defines at least one planar boss cap 164 spaced from the membrane 98. The boss cap 164 as shown is substantially aligned along the same plane as the membrane path 92, but in other embodiments, the boss cap 164 is offset above and/or below from the planar membrane path 94.

The membrane 98 includes at least two boss protrusions 166 that extend partially through the lower oxide layer 88 and contact the boss cap 164. The boss cap 164 and the boss protrusions 166 encapsulate a portion 168 of the lower oxide layer 88. The boss cap 164, the boss protrusions 166, and the encapsulated oxide portion 168 define the boss structure 162. Although only one boss structure 162 is described above, the pressure sensor 160 in some embodiments includes a plurality of boss structures 170 spaced from one another along the lower surface 108 of the membrane 98.

The boss structures 162 function to minimize oxide-induced stress within the membrane 98. In some embodiments, the boss structures 162 are positioned along the lower surface 108 of the membrane 98 in a pattern similar to that of spokes positioned about a hub of a wheel. In other embodiments, the boss structures 162 are positioned along the lower surface 108 in any manner that mitigates oxide-induced stress in the membrane 98.

Figure 5:
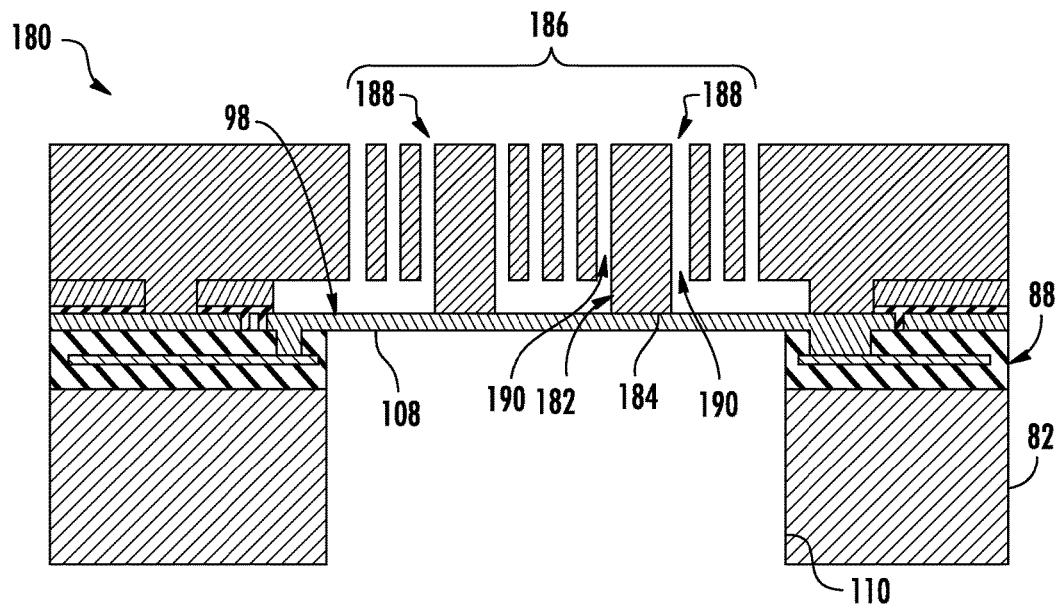
FIG. 5 shows the pressure sensor of FIG. 2 with a backplate layer modified to include at least one boss contacting an upper surface of the membrane.

FIG. 5 shows a pressure sensor 180 according to another embodiment. The pressure sensor 180 is similar to the pressure sensor 80 (FIG. 2) except that the backplate layer 86 includes at least one boss structure 182 that extends from the backplate layer 86 towards the upper surface 104 of the membrane 98. Although the boss structure 182 is shown with a tip portion 184 in contact with the membrane upper surface 104, the boss structure 182 in other embodiments is spaced from the membrane upper surface 104.

The boss structure 182 is laterally spaced from other portions of the backplate layer 86 by at least two etched portions 190 within a perforated region 186 of the backplate layer 86. The spacing set by the etched portions 190 is configured to reduce parasitic capacitance between the boss structure 182 and the other portions of the backplate layer 86. Although only one boss structure 182 is described above, the pressure sensor 180 in some embodiments includes a plurality of boss structures 188 positioned within the perforated region 186. In embodiments including a plurality of boss structures, the boss structures 162 are positioned within the backplate layer 86 in a pattern similar to that of segmented spokes positioned about a hub of a wheel. In other embodiments, the boss structures 162 are positioned in other patterns and may be positioned above or in contact with the upper surface 104 of the membrane 98.

Figure 6:
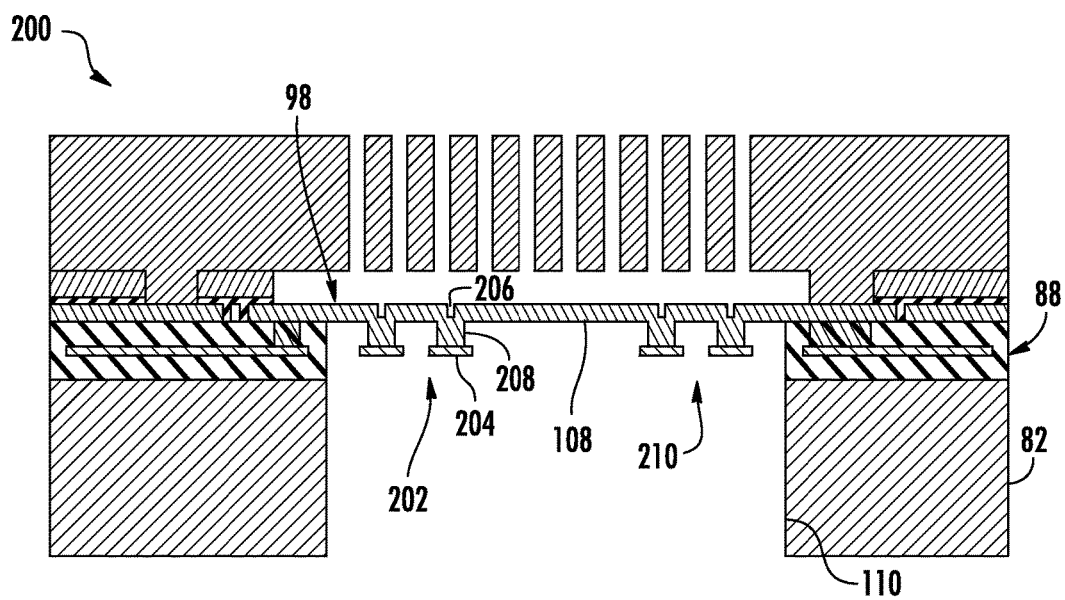
FIG. 6 shows the pressure sensor of FIG. 2 with the membrane modified to incorporate a plurality of corrugations.

FIG. 6 depicts a pressure sensor 200 according to another embodiment. The pressure sensor 200 is similar to the pressure sensor 80 (FIG. 2) except that at least one corrugation 202 is formed in the membrane 98. In addition to defining the membrane path 94, the contact layer 92 further defines at least one planar corrugation cap 204 spaced from the lower surface 108 of the membrane 98. The corrugation cap 204 as shown is substantially aligned along the same plane as the membrane path 92, but in other embodiments, the corrugation cap 204 is offset above and/or below from the planar membrane path 94.

In a region corresponding to the corrugation cap 204, the membrane 98 includes an etched portion 206 that extends into the upper surface 104 of the membrane 98. A protrusion 208 extends away from the lower surface 108 of the membrane 98 at a location opposite the etched portion 206 and contacts the corrugation cap 204. The corrugation cap 204, the etched portion 206, and the protrusion define the corrugation 202 in the membrane surfaces 104 and 108. Although only one corrugation 202 is described above, the pressure sensor 200 in some embodiments includes a plurality of spaced corrugations 210 disposed about a perimeter of the membrane 98. In some embodiments with more than one corrugation 210, the corrugations are spaced in series along the membrane 98. The corrugations 210 function to decouple the membrane 98 from the oxide-based lower clamping portions 134 and to mitigate the impact of external stresses on the membrane 98.

Figure 7:
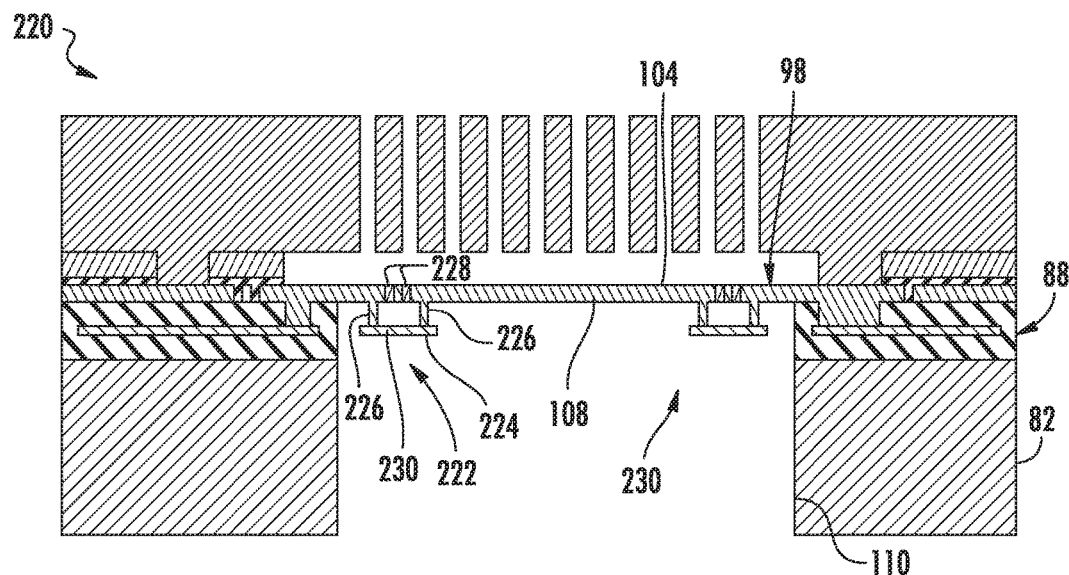
FIG. 7 depicts the pressure sensor of FIG. 2 with the membrane modified to incorporate a plurality of perforations.

FIG. 7 depicts a pressure sensor 220 according to another embodiment. The pressure sensor 220 is similar to the pressure sensor 80 (FIG. 2) except that the membrane 98 includes at least one sealed perforated structure 222. In addition to defining the membrane path 94, the contact layer 92 further defines at least one planar perforation cap 224 spaced from the membrane 98. The perforation cap 224 as shown is substantially aligned along the same plane as the membrane path 92, but in other embodiments, the perforation cap 224 is offset above and/or below from the planar membrane path 94.

The membrane 98 includes at least two protrusions 226 that extend away from the membrane lower surface 108 and contact the perforation cap 224. At least one sealed etched portion 228 extends through the membrane 98 between the at least two protrusions 226. The perforation cap, 224, the protrusions 226, and the portion of the membrane 98 between the protrusions 226 form a sealed cavity 230 below the membrane 98 and define the perforated structure 222. Although only one perforated structure 222 is described above, the pressure sensor 220 in some embodiments includes a plurality of spaced perforated structures 232 disposed about a perimeter of the membrane 98.

The perforated structures 232 function to decouple the membrane 98 from the oxide-based lower clamping portions 134 and to mitigate the impact of external stresses on the membrane 98. The perforated structures 232 also function as a sealing area to enclose low pressure between the membrane 98 and the backplate layer 86. In the embodiment shown, the device layer 84 is highly perforated so as to support the membrane 98 and allow the membrane 98 to deflect in a parallel plate mode.

Figure 8:
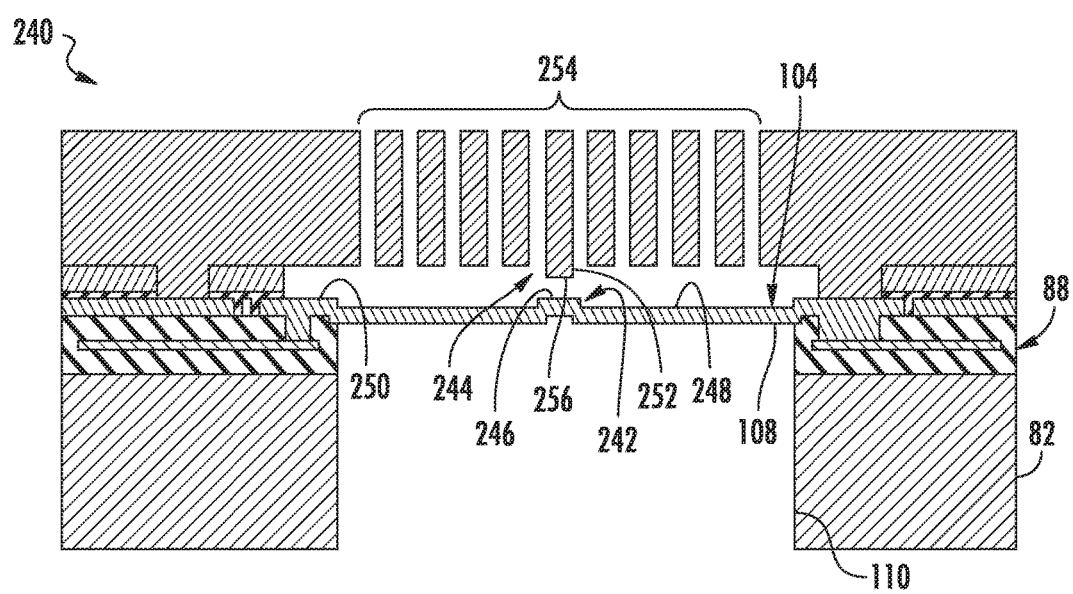
FIG. 8 depicts the pressure sensor of FIG. 2 with at least one membrane over-travel stop and at least one backplate over-travel stop.

FIG. 8 depicts a pressure sensor 240 according to another embodiment. The pressure sensor 240 is similar to the pressure sensor 80 (FIG. 2) except that the membrane 98 includes a membrane over-travel stop 242 and the backplate layer 86 includes a backplate layer over-travel stop 244. In the embodiment shown, the membrane 98 includes a central portion 246, an intermediate portion 248 that at least partially surrounds the central portion 246, and a peripheral portion 250 that at least partially surrounds the intermediate portion 248. The intermediate portion 248 is offset from the central and the peripheral portions 246 and 250 in a downward direction as viewed in the figure. The offset of the intermediate portion 248 about the central portion 246 defines a plane above which the membrane over-travel stop 242 extends. Although the central portion 246 of the membrane 98 is shown aligned substantially along the same plane as the peripheral portion 250, the central portion 246 in other embodiments is offset above or below the plane of the peripheral portion 250.

With continuing reference to FIG. 8, at least one dimple 252 extends downwardly beneath a plane generally defined by the backplate layer 86 within a perforated region 254 of the backplate layer 86. The dimple has a tip portion 256 that forms the backplate layer over-travel stop 244. The backplate layer over-travel stop 244 is configured to contact the upper surface 104 of the membrane during an over-travel of membrane 98 towards the backplate layer 86. In the embodiment shown, the dimple 252 is positioned centrally above the membrane over-travel stop 242 such that the backplate layer over-travel stop 244 contacts the membrane over-travel stop 242 during an over-travel of the membrane 98. In other embodiments, the pressure sensor 240 includes only one of the membrane over-travel stop 242 and the backplate layer over-travel stop 244.

The over-travel stops 242 and 244 allow the pressure sensor 240 to be exposed to larger operational pressures. The pressure sensor 240 in this embodiment also remains functional after contact between the device layer 84 and the backplate layer 86 at either or both of the over-travel stops 242 and 244. In the embodiment shown, the backplate layer over-travel stop 244 is on the device layer 84 potential so as to enable a higher operational pressure range for the pressure sensor 240. In other embodiments, the backplate layer over-travel stop 244 is isolated or is on the backplate layer 86 potential.

The features of the pressure sensors disclosed above with reference to FIGS. 1-8 can be combined in any suitable manner to provide numerous pressure sensor variants with a multitude of functional capabilities.

Figure 9:
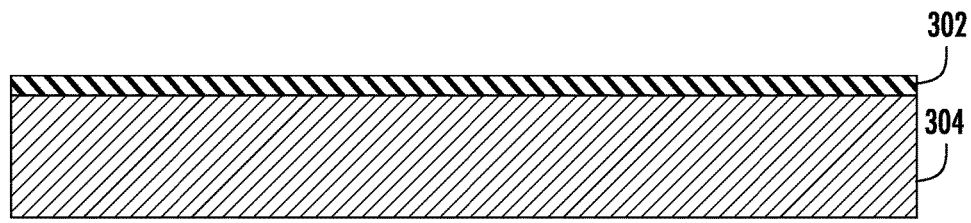
FIGS. 9-22 show a process for forming the pressure sensor of FIG. 1.
Figure 10:
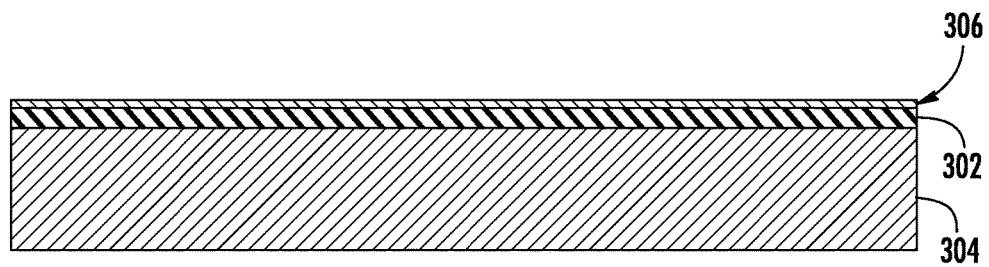
Figure 11:
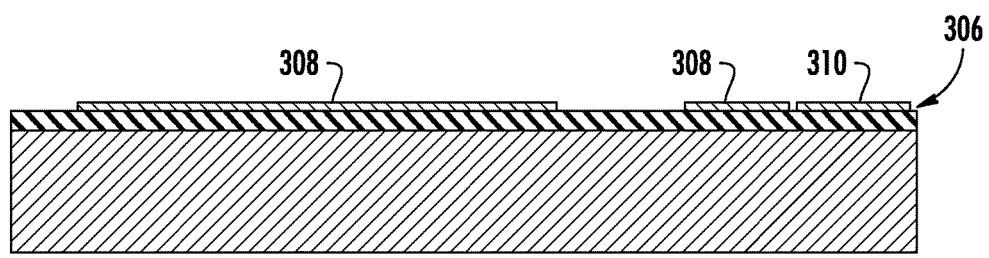

A process for forming a pressure sensor such as the pressure sensor 10 of FIG. 1 is discussed below with reference to FIGS. 9-22. Referring initially to FIG. 9, an oxide portion 302 is formed in a layer above a silicon base layer 304. A layer of poly-silicon is then deposited above the oxide portion 302 to form a contact layer 306 (FIG. 10). The contact layer 306 in the embodiment shown is deposited by low-pressure chemical vapor deposition (LPCVD) to a thickness of 0.3 to 2 µm. The contact layer 306 is patterned to form an electrically conductive membrane path 308 and an electrically conductive a backplate path 310 (FIG. 11).

Figure 12:
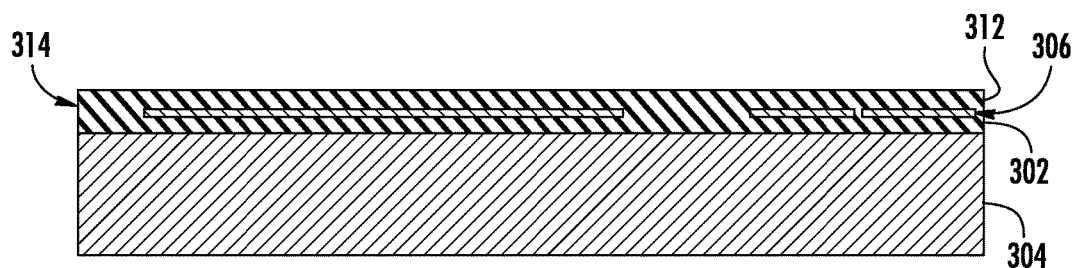
Figure 13:
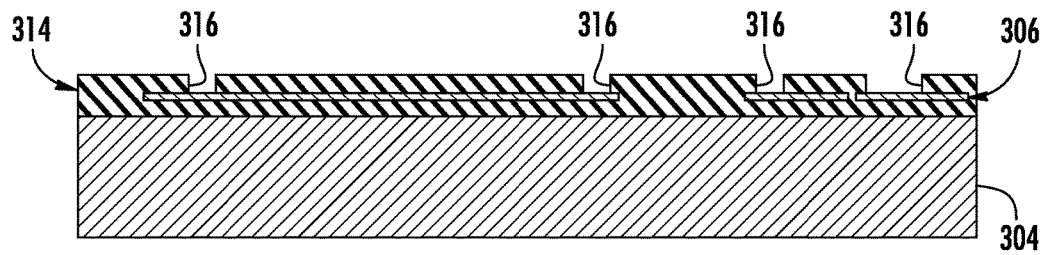

Referring now to FIG. 12, an oxide portion 312 is formed above the patterned contact layer 306 and the oxide portion 302. The oxide portions 302 and 312 form a lower oxide layer 314 that substantially encapsulates the contact layer 306. The lower oxide layer 314 is etched to form a plurality of etched portions 316 that expose respective portions of the contact layer 306 (FIG. 13).

Figure 14:
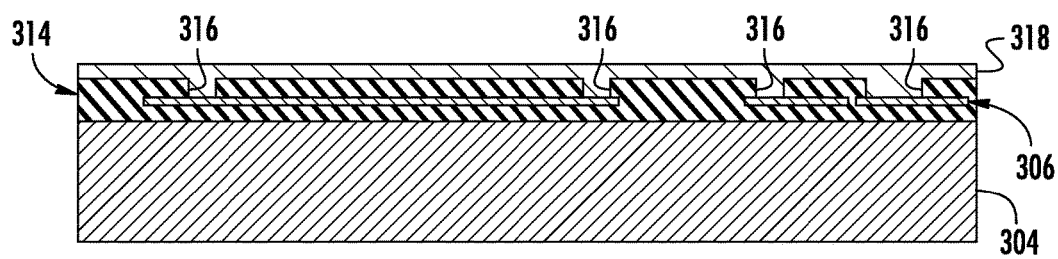

A layer of poly-silicon is then deposited above the etched lower oxide layer 314 to form a device layer 318 (FIG. 14). The device layer 318 in the embodiment shown is deposited to a thickness of 1 to 20 µm. In some embodiments, the poly-silicon is deposited by an LPCVD process, while in other embodiments the poly-silicon is deposited by an epitaxial process. The device layer 318 is in electrical communication with the contact layer 306 through the silicon-filled etched portions 316 after the deposition of the device layer 318.

Figure 15:
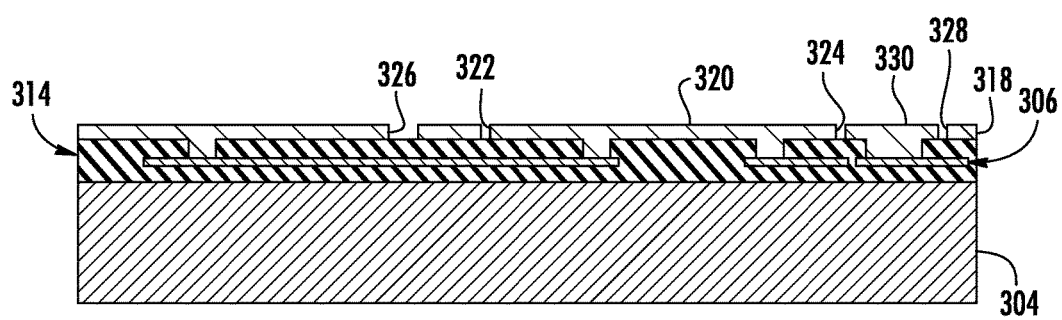

With reference now to FIG. 15, the device layer 318 is etched to define a membrane 320 between two etched portions 322 and 324. An etched portion 326 is etched into the device layer 318 leftward from the etched portion 322 as viewed in the figure, and an etched portion 328 is etched into the device layer 318 rightward from the etched portion 324 as viewed in the figure. The etched portion 324 and the etched portion 328 define a connector 330 within the device layer 318 which adjoins the backplate path 310 for electrical communication therebetween.

Figure 16:
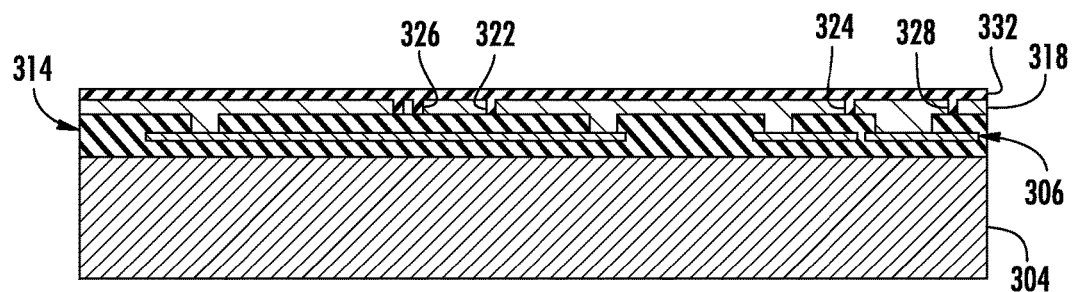
Figure 17:
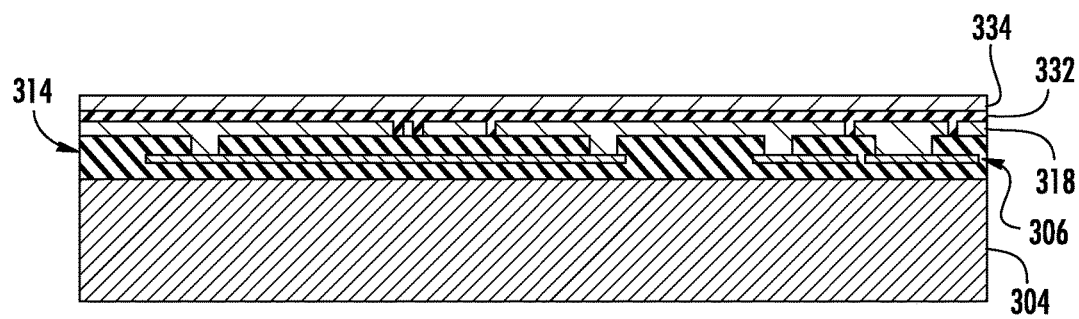
Figure 18:
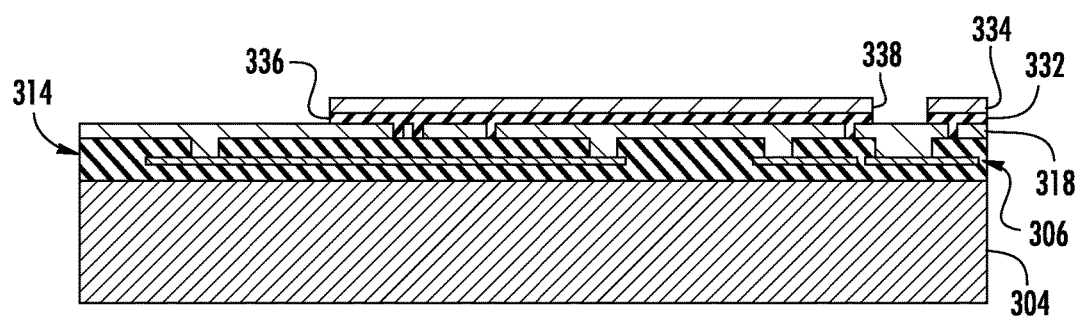

A layer of silicon nitride [confirm material with inventors] is then deposited above the device layer 318 to form a nitride layer 332 (FIG. 16). The deposited silicon nitride fills the etched portions 322, 324, 326, and 328 and further insulates the membrane 320 and the connector 330 within the device layer 318. A layer of oxide is then formed above the nitride layer 332 to form an upper oxide layer 334 (FIG. 17). The upper oxide layer 334 and the nitride layer 332 are etched to form etched portions 336 and 338 which expose portions of the device layer 318 (FIG. 18). The etched portion 338 is formed above the connector 330 defined in the device layer 318.

Figure 19:
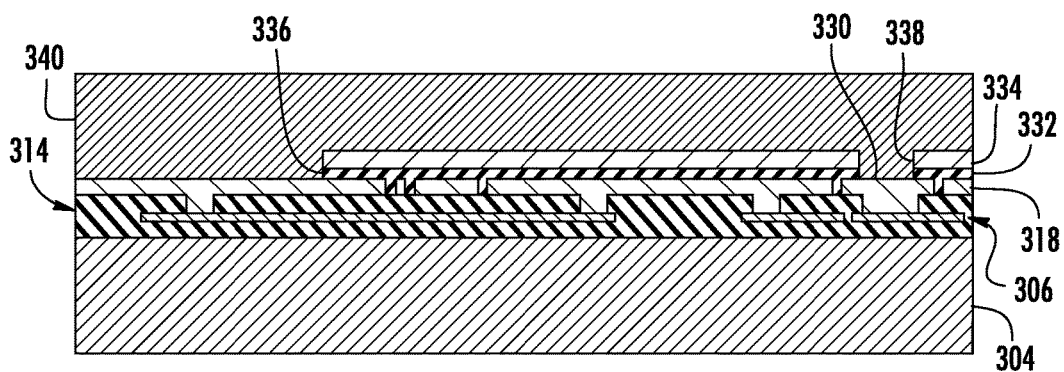

An epitaxial poly-silicon layer is then deposited above the etched upper oxide and nitride layers 334 and 332 and the exposed portions of the device layer 318 to form a backplate layer 340 (FIG. 19). The backplate layer 340 in the embodiment shown is deposited to a thickness of 5 to 50 µm. The deposition of the backplate layer 340 fills in the etched portions 336 and 338 with the poly-silicon. The backplate layer 340 is in electrical communication with the backplate path 310 through the silicon-filled etched portion 338 and the connector 330.

Figure 20:
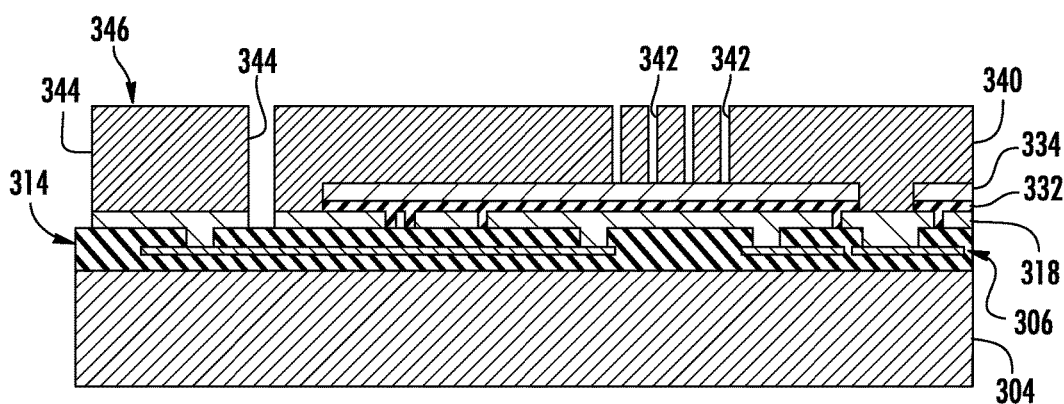

With reference now to FIG. 20, a plurality of vent holes or perforations 342 are etched through the backplate layer 340 to expose portions of the upper oxide layer 334. The vent holes 342 are formed at least partially centrally above the membrane 320 defined in the device layer 318. In a portion of the backplate layer 340 adjacent to the device layer 318 and leftward from the vent holes 342, trench portions 344 are etched through the backplate layer 340 and the device layer 318 to the lower oxide layer 314. The trench portions 344 expose portions of the lower oxide layer 314 and isolate a bond member 346 within the backplate and the device layers 340 and 318.

Figure 21:
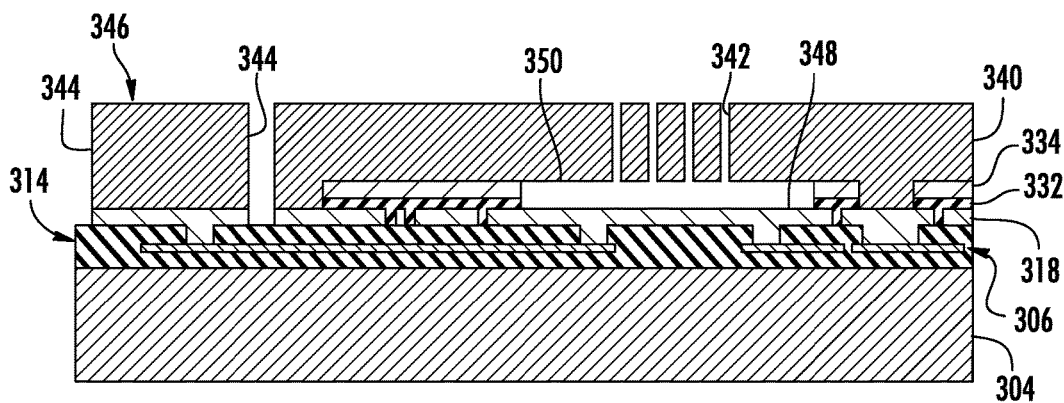

Referring now to FIG. 21, a timed vapor etch release is performed through the vent holes 342 which releases a portion of the upper oxide layer 334 and the nitride layer 332 and exposes an upper surface 348 of the membrane 320. In some embodiments, the etch release is a hydrofluoric acid (HF) vapor etch release. In other embodiments, other etch release processes are implemented to etch the upper oxide layer 334 and the nitride layer 332. The etching process forms a cavity 350 bounded laterally by the upper oxide layer and nitride layer portions remaining after the timed vapor etch release. The cavity 348 and the remaining upper oxide layer and nitride layer portions electrically decouple the membrane 320 from the backplate layer 340.

Figure 22:
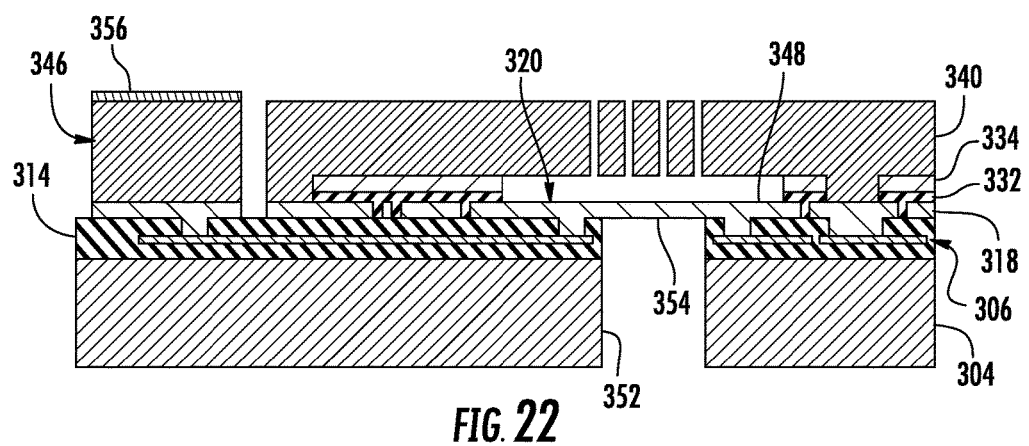

Referring now to FIG. 22, a backside trench 352 is etched from portions of the base layer 304 and the lower oxide layer 314 to expose a lower surface 354 of the membrane 320. A layer of metal is deposited on the bond member 346 to form a bond pad 356 thereon. Referring again to FIG. 1, a pre-formed cap wafer or ASIC wafer 66 is attached to an upper surface 62 of the backplate layer 66 (340 in FIG. 22). A seal 68 is positioned between the backplate layer upper surface 62 and the cap wafer 66 so that low pressure is hermetically sealed between the membrane 28 (320 in FIG. 22) and the cap wafer 66.

Figure 23:
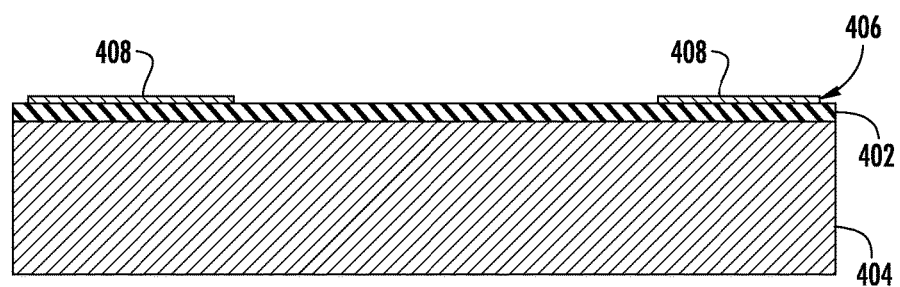
FIGS. 23-33 depict a process for forming the pressure sensor of FIG. 2.

A process for forming a pressure sensor such as the pressure sensor 80 of FIG. 2 is discussed below with reference to FIGS. 23-33. Referring initially to FIG. 23, an oxide portion 402 is formed in a layer above a silicon base layer 404, and a layer of poly-silicon is deposited above the oxide portion 402 to form a contact layer 406. The contact layer 406 in the embodiment shown is deposited by LPCVD to a thickness of 0.3 to 2 µm. The contact layer 406 is then patterned to form an electrically conductive membrane path 408.

Figure 24:
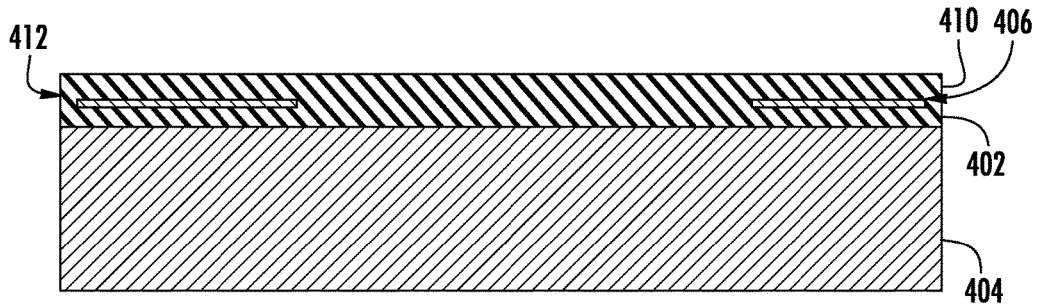
Figure 25:
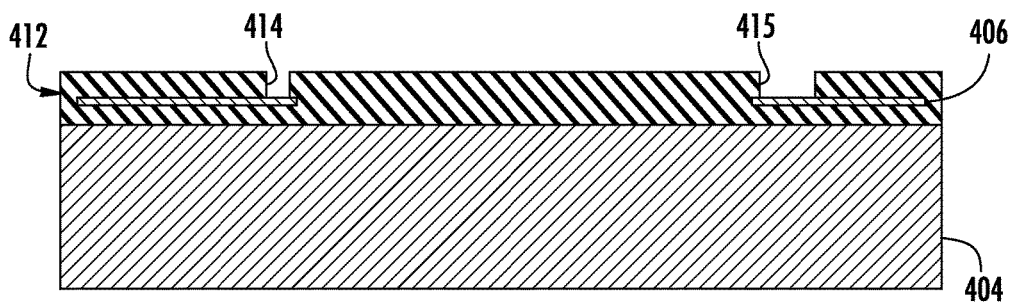

Referring now to FIG. 24, an oxide portion 410 is formed above the patterned contact layer 406 and the oxide portion 402. The oxide portions 402 and 410 form a lower oxide layer 412 that substantially encapsulates the contact layer 406. The lower oxide layer 412 is then etched to form etched portions 414 and 415 that expose respective portions of the contact layer 406 (FIG. 25).

Figure 26:
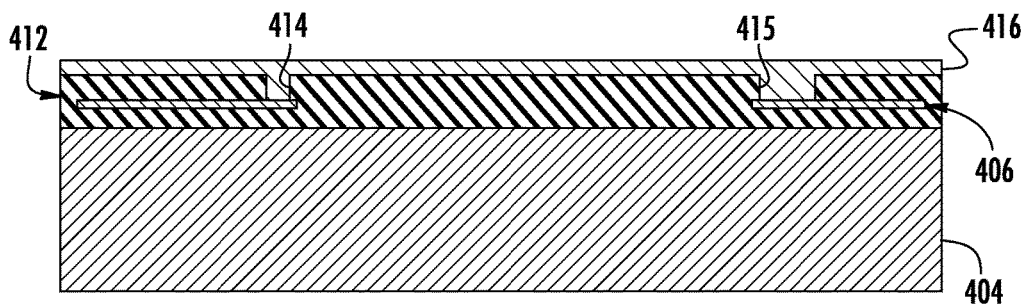

A layer of poly-silicon is then deposited above the etched lower oxide layer 412 to form a device layer 416 (FIG. 26). The device layer 416 in the embodiment shown is deposited to a thickness of 1 to 20 µm. In some embodiments, the poly-silicon is deposited by an LPCVD process, while in other embodiments the poly-silicon is deposited by an epitaxial process. The device layer 412 is in electrical communication with the contact layer 406 through the silicon-filled etched portions 414 and 415 after the deposition of the device layer 412.

Figure 27:
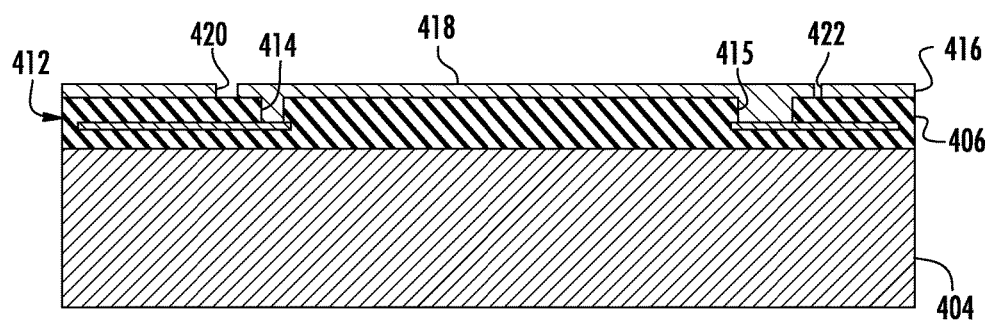

With reference now to FIG. 27, the device layer 416 is etched to define a membrane 418 between two etched portions 420 and 422. The etched portion 420 is etched into the device layer 416 leftward from the etched portion 414 as viewed in the figure, and the etched portion 422 is etched into the device layer 416 rightward from the etched portion 415 as viewed in the figure.

Figure 28:
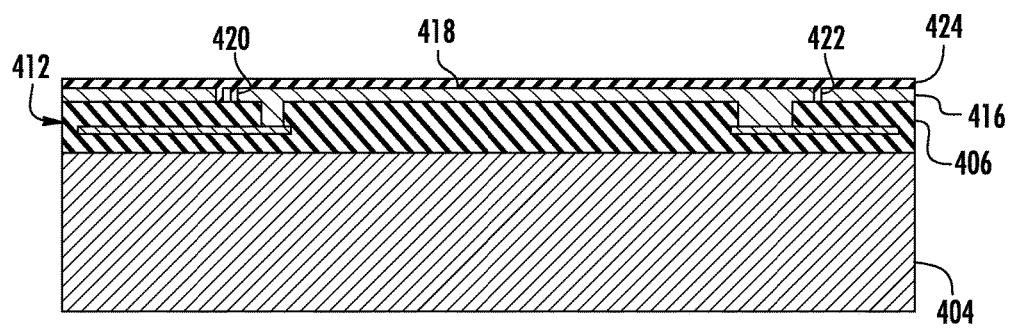
Figure 29:
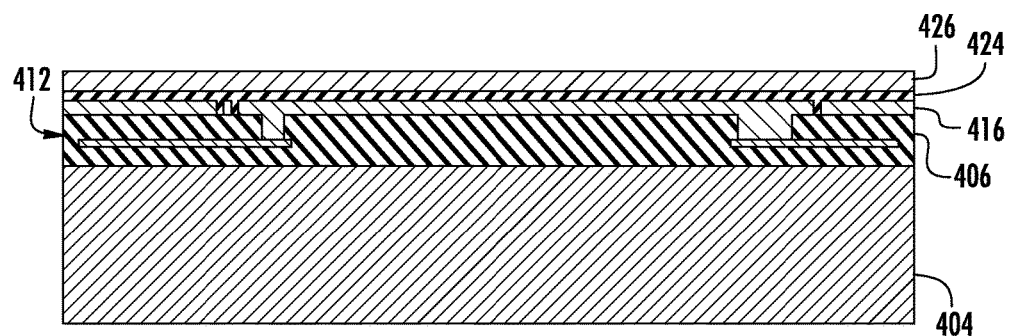
Figure 30:
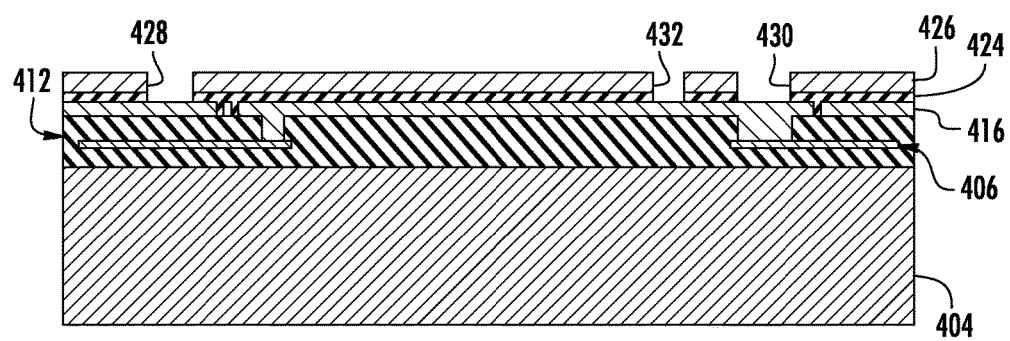

A layer of silicon nitride [confirm material with inventors] is then deposited above the device layer 416 to form a nitride layer 424 (FIG. 28). The deposited silicon nitride at least partially fills the etched portions 420 and 422 and further insulates the membrane 418 within the device layer 416. A layer of oxide is then formed above the nitride layer 424 to form an upper oxide layer 426 (FIG. 29). The upper oxide layer 426 and the nitride layer 424 are etched to form etched portions 428 and 430 which expose portions of the device layer 416 (FIG. 30). The etched portion 428 is formed leftward of the silicon-filled etched portion 420 in the device layer 416. The etched portion 430 is formed above the silicon-filled etched portion 415 in the device layer 416. In the embodiment shown, the upper oxide layer 426 is further etched to form etched portion 432 to expose another portion of the device layer 416. The etched portion 432 is formed between the etched portions 428 and 430 and located proximate to the etched portion 430. In some embodiments, the etched portion 432 is not formed in the device layer 416.

Figure 31:
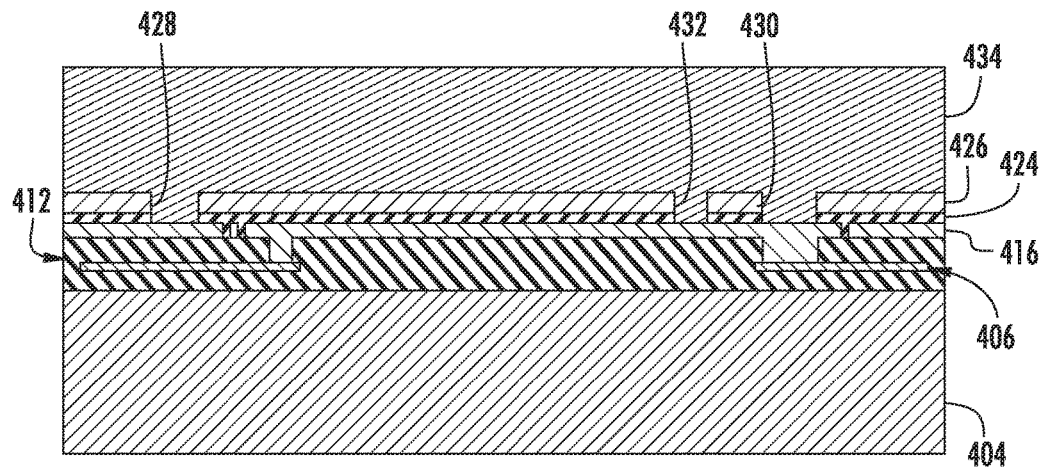

An epitaxial poly-silicon layer is then deposited above the etched upper oxide and nitride layers 426 and 424 and the exposed portions of the device layer 416 to form a backplate layer 434 (FIG. 31). The backplate layer 434 in the embodiment shown is deposited to a thickness of 5 to 50 µm. The deposition of the backplate layer 434 fills in the etched portions 428, 430, and 432 with the epi-poly silicon.

Figure 32:
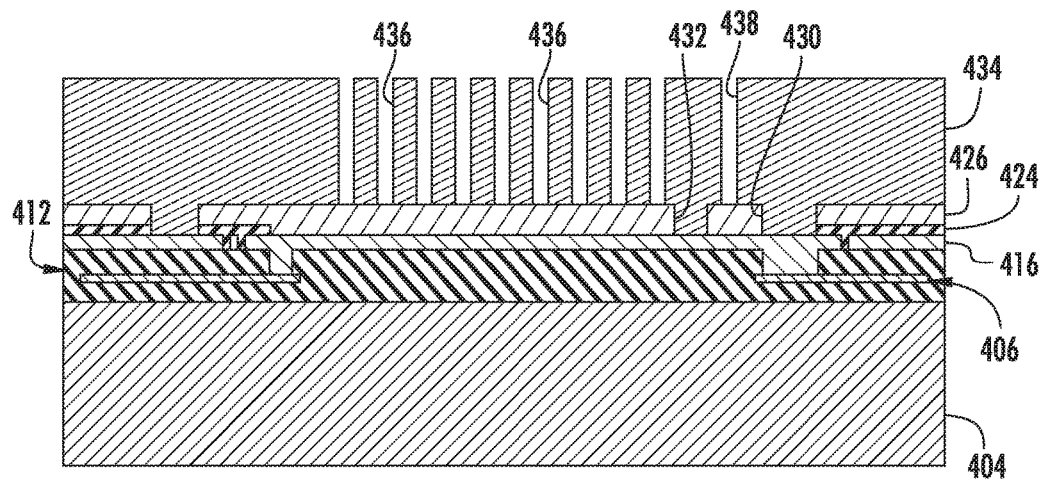

With reference now to FIG. 32, a plurality of vent holes or perforations 342 are etched through the backplate layer 434 to expose portions of the upper oxide layer 426. The vent holes 436 are formed at least partially centrally above the membrane 418 defined in the device layer 416. In the embodiment shown, at least one vent hole 438 is formed through the backplate layer 434 to expose a portion of the upper oxide layer 426 disposed between the silicon-filled etched portions 430 and 432.

Figure 33:
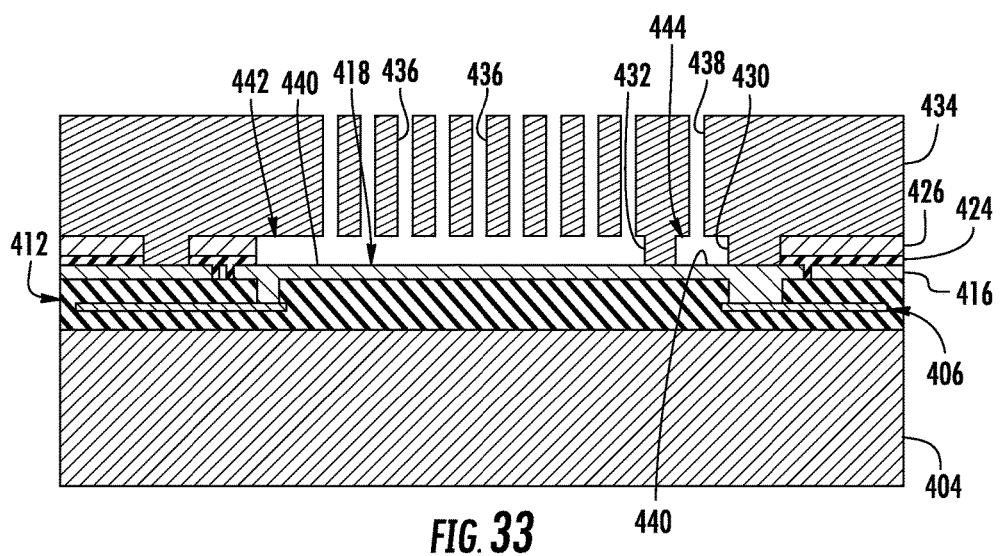

Referring now to FIG. 33, a timed vapor etch release is performed through the vent holes 436 which releases a portion of the upper oxide layer 426 and the nitride layer 424 and exposes an upper surface 440 of the membrane 418. In some embodiments, the etch release is a hydrofluoric acid (HF) vapor etch release. In other embodiments, other etch release processes are implemented to etch the upper oxide layer 426 and the nitride layer 424. A vapor etch release is also performed through vent hole 438 which releases the upper oxide layer 426 and the nitride layer 424 and exposes the upper surface 440 of the membrane 418 between the silicon-filled etched portions 430 and 432.

The etching process forms a cavity 442 bounded laterally on the left as viewed in the figure by the upper oxide layer and nitride layer portions remaining after the timed vapor etch release and bounded laterally on the right as viewed in the figure by the silicon-filled etched portion 432. The etching process also forms a cavity 444 bounded laterally by the silicon-filled etched portions 430 and 432.

Referring again to FIG. 2, a backside trench 110 is then etched from portions of the base layer 82 (404 in FIG. 33) and the lower oxide layer 88 (412 in FIG. 33) to expose a lower surface 108 of the membrane 98 (418 in FIG. 33).

Figure 34:
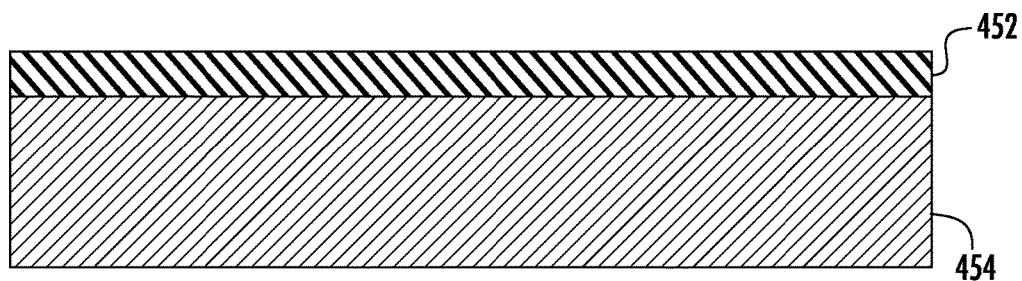
FIGS. 34-44 illustrate a modification of the process of FIGS. 23-33 for forming the pressure sensor of FIG. 3.
Figure 35:
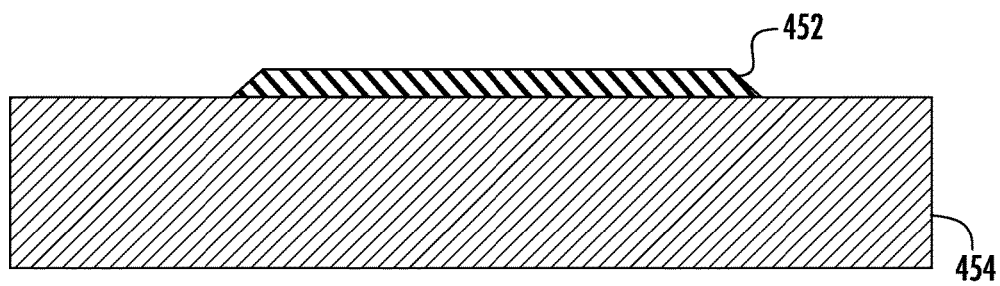

The above-described process for forming the pressure sensor 80 (FIG. 23-33) can be modified in a number of ways to produce additional pressure sensor variants. By way of example, a process for forming a pressure sensor such as the pressure sensor 140 of FIG. 3 is discussed below with reference to FIGS. 34-44. Referring initially to FIG. 34, a lower oxide portion 452 is formed in a layer above a silicon base layer 454. The lower oxide portion 452 is then shaped to form a trapezoidal shape as depicted in FIG. 35. In some embodiments, the lower oxide portion 452 is processed into a shape different than a trapezoid, such as an elongated oval shape. A chemical mechanical polishing (CMP) process that can be used to form oblique features in substrates, such as the oblique features of the shaped oxide portion 452, is described in more detail in U.S. Pat. No. 8,580,691, the disclosure of which is incorporated herein by reference in its entirety.

Figure 36:
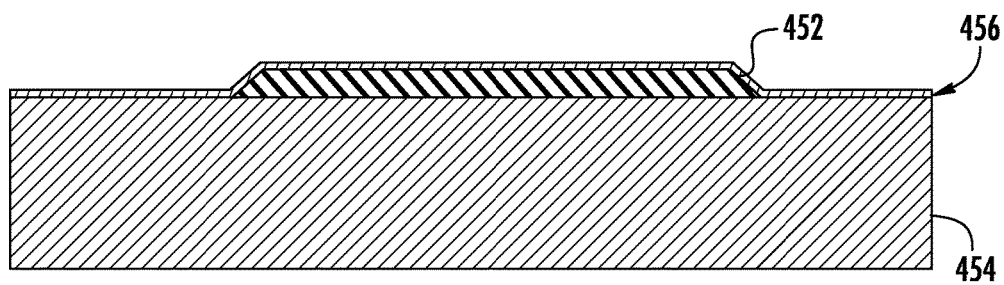
Figure 37:
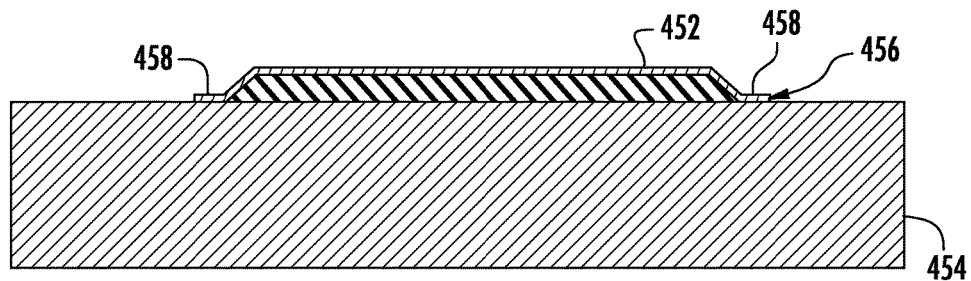

A lower portion 456 of poly-silicon is then deposited in a layer above the base layer 454 and the shaped lower oxide portion 452 (FIG. 36). The lower poly-silicon portion 456 in the embodiment shown is deposited by LPCVD to a thickness of 0.3 to 2 µm. The lower poly-silicon portion 456 is then patterned to expose portions of the base layer 454 and form planar lip portions 458 adjacent to the base layer 454 (FIG. 37).

Figure 38:
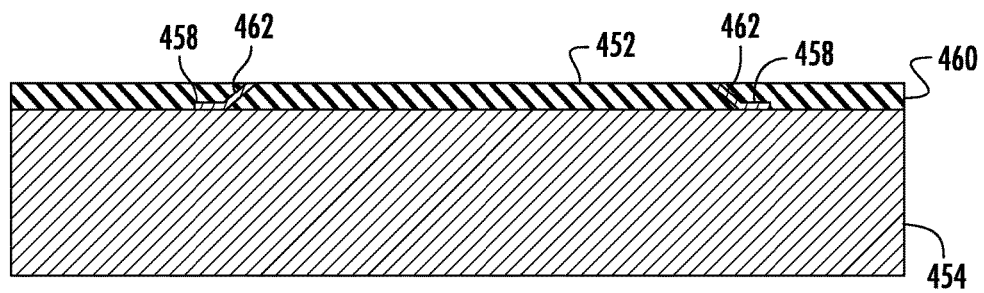

Referring now to FIG. 38, an intermediate oxide portion 460 is formed in a layer above the exposed base layer 454 and the patterned lower poly-silicon portion 456. The intermediate oxide portion 460 is then planarized using a known planarization process. The intermediate oxide portion 460 is formed to a thickness large enough that, after the planarization process, the lip portions 458 and oblique portions 462 of the lower poly-silicon portion 456 remain encapsulated within the intermediate oxide portion 460.

Figure 39:
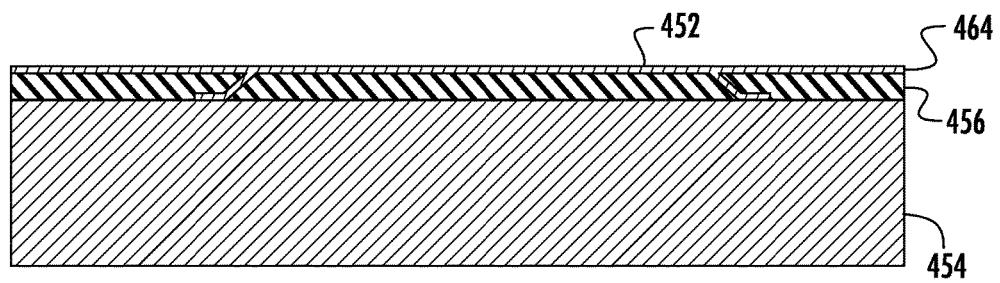
Figure 40:
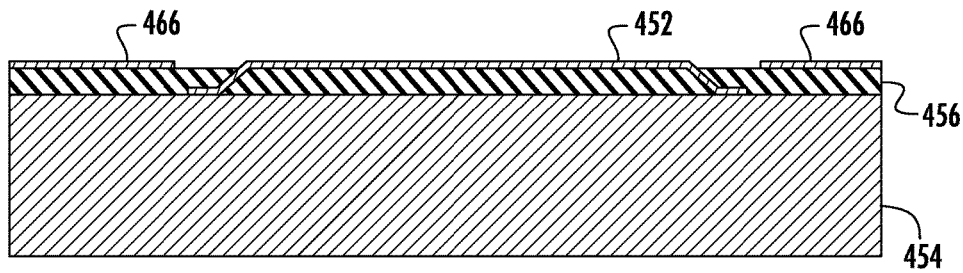

An upper portion 464 of poly-silicon is then deposited in a layer above the planarized portions of the intermediate oxide portion 460 and of the lower poly-silicon portion 456 (FIG. 39). The upper poly-silicon portion 464 is then patterned to separate a peripheral portion 466 of poly-silicon from a central portion 468 of poly-silicon. As shown in the cross-sectional view of the figure, the central poly-silicon portion 468, the oblique portions 462, and the lip portions 458 form a continuous shield layer 470 of poly-silicon in the shape of an inverted-cup.

Figure 41:
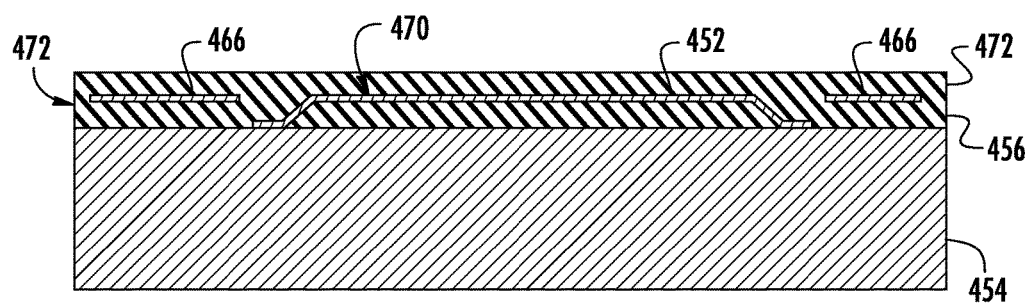
Figure 42:
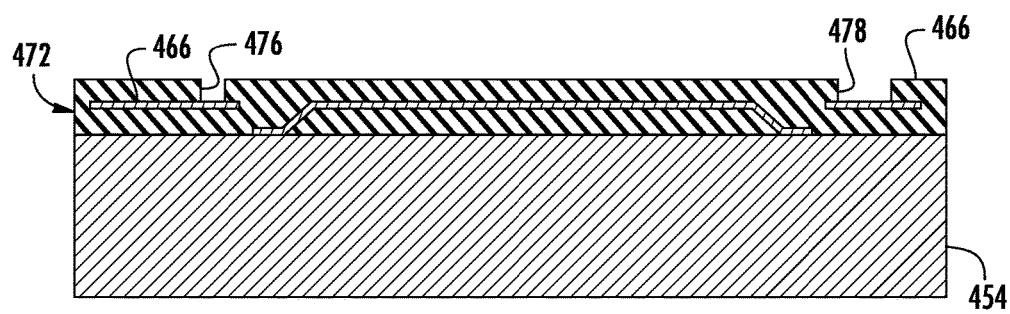

Referring now to FIG. 41, an upper oxide portion 472 is formed above the patterned upper poly-silicon portion 464 and the intermediate oxide portion 460. In the embodiment shown, the upper oxide portion 472 is formed to a thickness of approximately 1.1 µm. The oxide portions 452, 460, and 472 form a lower oxide layer 474 that substantially encapsulates the poly-silicon portions 456 and 464. The lower oxide layer 474 is then etched to form etched portions 476 and 478 that expose respective portions of the peripheral poly-silicon portion 466 (FIG. 42).

Figure 43:
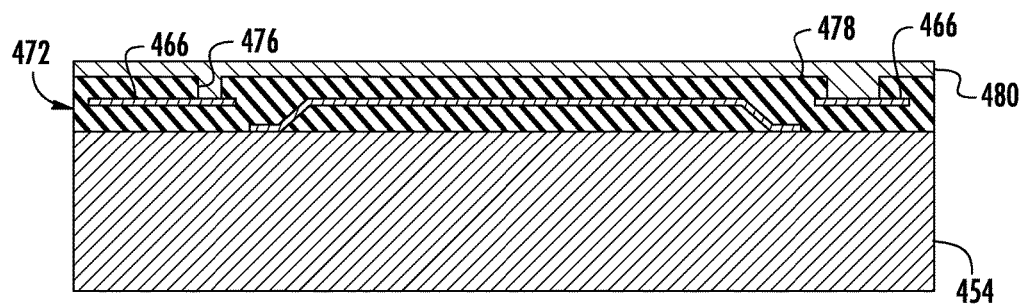

A layer of poly-silicon is then deposited above the etched lower oxide layer 474 to form a device layer 480 (FIG. 43). The device layer 480 in the embodiment shown is deposited to a thickness of 1 to 20 µm. In some embodiments, the poly-silicon is deposited by an LPCVD process, while in other embodiments the poly-silicon is deposited by an epitaxial process. The device layer 480 is in electrical communication with the peripheral poly-silicon portion 466 through the silicon-filled etched portions 476 and 478 after the deposition of the device layer 480.

Figure 44:
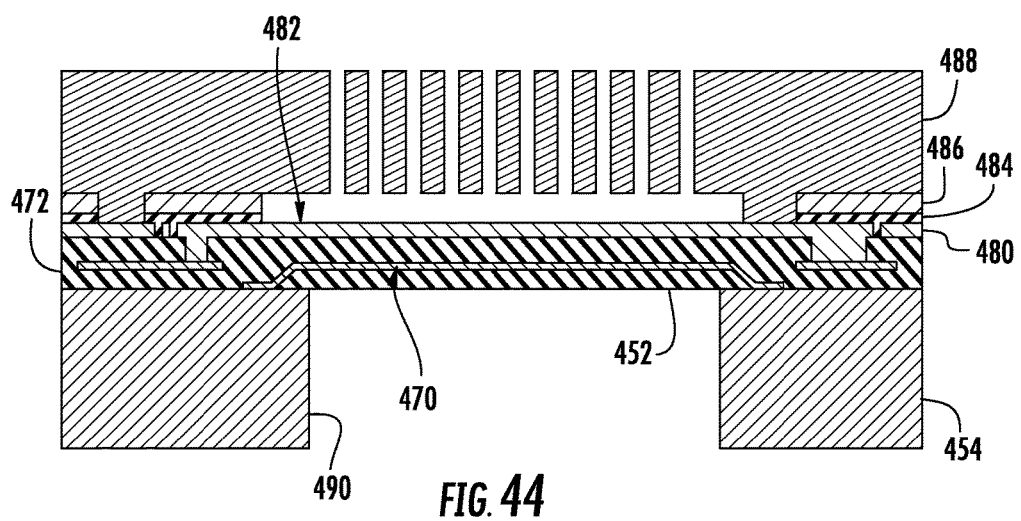

The processes discussed above with reference to FIGS. 27-33 are then implemented to define a membrane 482 within the device layer 480 and to form a nitride layer 484, an upper oxide layer 486, and a backplate layer 488 as depicted in FIG. 44. A backside trench 490 is then etched through a portion of the base layer 454 to expose the remaining lower oxide portion 452.

Referring now to FIG. 3, a vapor etch release is performed through the backside etched portion 110 (backside trench 490 in FIG. 44) which releases the lower oxide portion (452 in FIG. 44) and exposes a lower surface 148 of the central portion 144 (shield layer 470 in FIG. 44). In some embodiments, the etch release is a hydrofluoric acid (HF) vapor etch release. The central portion 144 (shield layer 470 in FIG. 44) functions as a lateral etch stop during the HF vapor etch release of the lower oxide portion (452 in FIG. 44).

Figure 45:
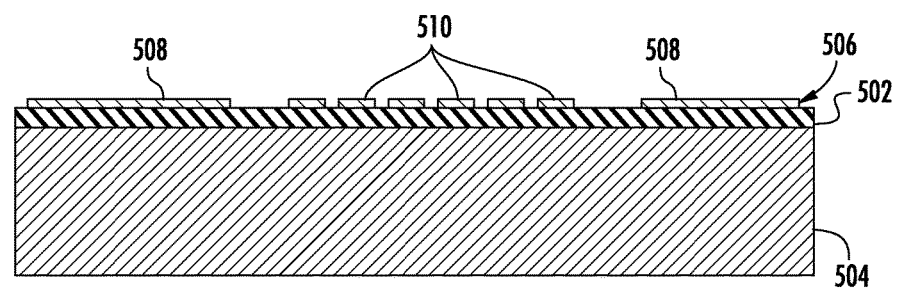
FIGS. 45-50 show a modification of the process of FIGS. 23-33 for forming the pressure sensor of FIG. 4.

By way of another example, a process for forming a pressure sensor such as the pressure sensor 160 of FIG. 4 is discussed below with reference to FIGS. 45-50. Referring initially to FIG. 45, an oxide portion 502 is formed in a layer above a silicon base layer 504, and a layer of poly-silicon is deposited above the lower oxide portion 502 to form a contact layer 506. The contact layer 506 in the embodiment shown is deposited by LPCVD to a thickness of 0.3 to 2 µm. The contact layer 406 is then patterned to form an electrically conductive contact path 508 and a plurality of planar cap portions 510.

Figure 46:
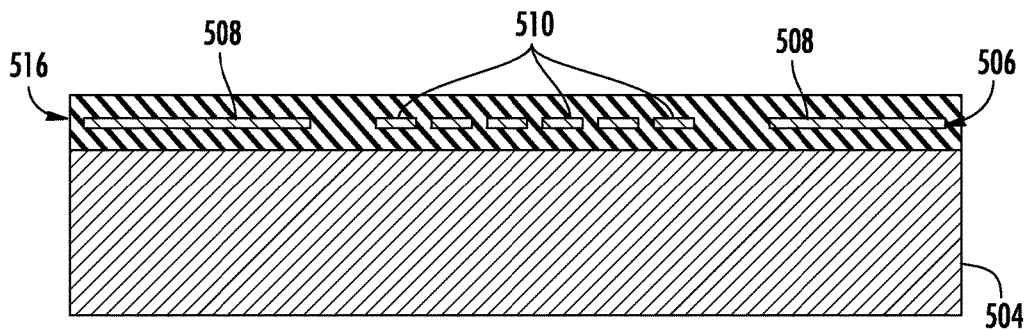
Figure 47:
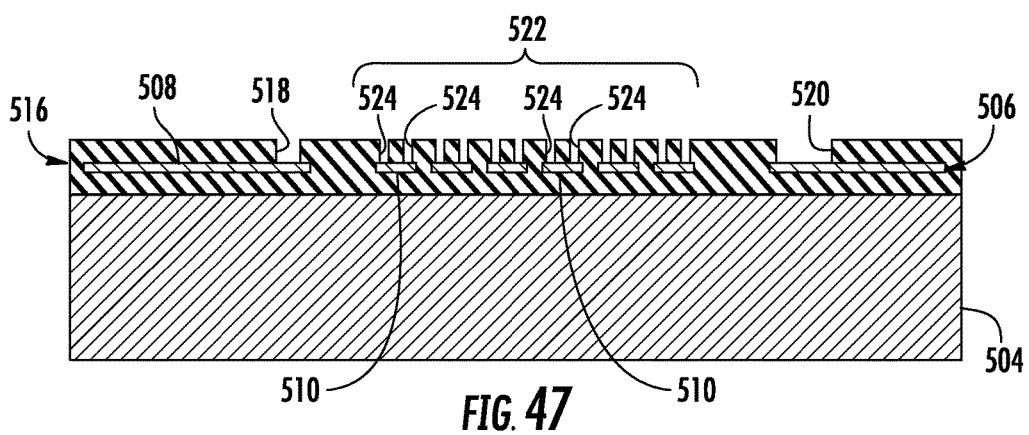

Referring now to FIG. 46, an oxide portion 514 is formed above the patterned contact layer 506 and the oxide portion 502. The oxide portions 502 and 514 form a lower oxide layer 516 that substantially encapsulates the contact path 508 and each of the cap portions 510. The lower oxide layer 516 is then etched to form etched portions 518 and 520 that expose respective portions of the contact path 508 (FIG. 47). The etching of the lower oxide layer 516 also forms a plurality of etched portions 522 with adjacent pairs 524 of the etched portions 522 etched to expose the respective cap portions 510.

Figure 48:
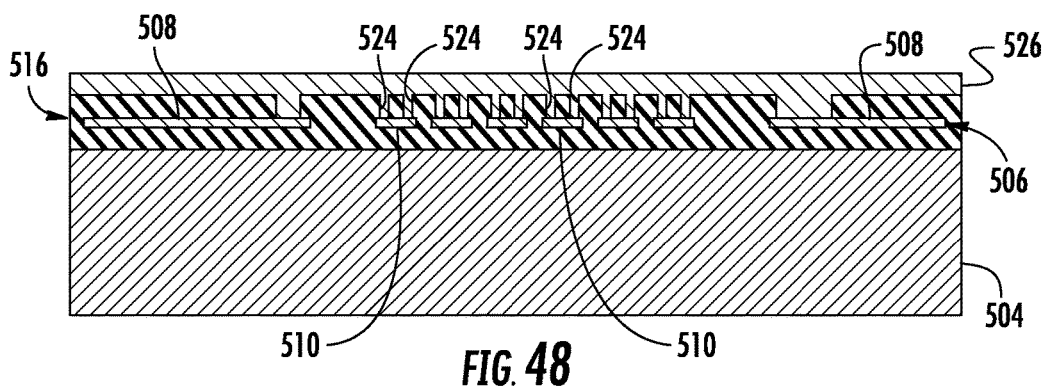

A layer of poly-silicon is then deposited above the etched lower oxide layer 516 to form a device layer 526 (FIG. 48). The device layer 526 in the embodiment shown is deposited to a thickness of 1 to 20 µm. In some embodiments, the poly-silicon is deposited by an LPCVD process, while in other embodiments the poly-silicon is deposited by an epitaxial process. The device layer 526 is in electrical communication with the contact path 508 through the silicon-filled etched portions 518 and 520 after the deposition of the device layer 526. The device layer 526 also contacts the cap portions 510 through the silicon-filled etched portions 522 and 524.

Figure 49:
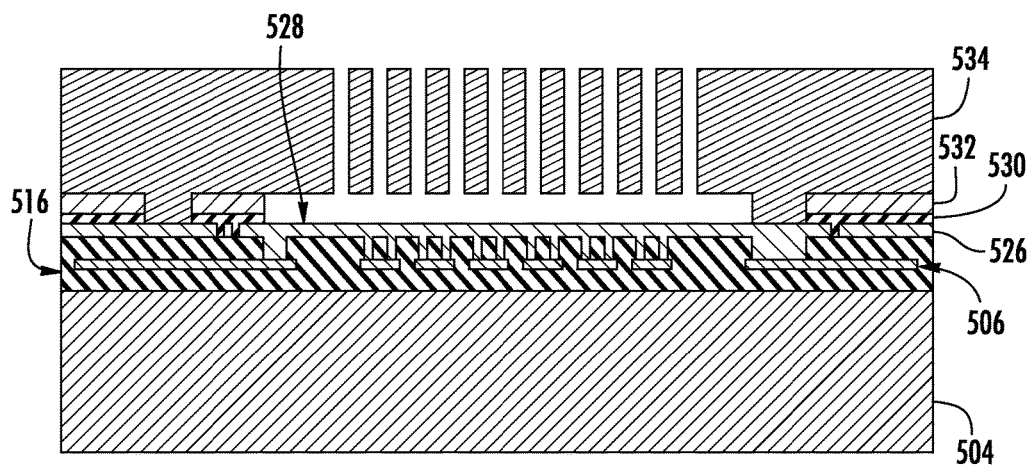

The processes described above with reference to FIGS. 27-33 are then implemented to define a membrane 528 within the device layer 526 and to form a nitride layer 530, an upper oxide layer 532, and a backplate layer 534 as depicted in FIG. 49. A backside trench 536 is then etched through a portion of the base layer 504 to expose the lower oxide layer 516 (FIG. 50).

Figure 50:
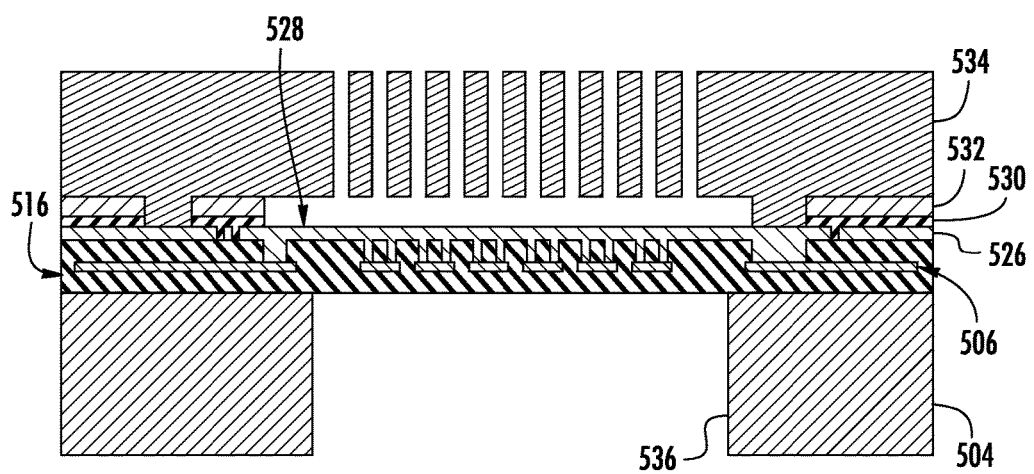

Referring now to FIG. 4, a timed vapor etch release is performed through the backside etched portion 110 (backside trench 536 in FIG. 50) which releases a portion of the lower oxide layer 88 (516 in FIG. 50) and exposes a lower surface 108 of the membrane 98 (528 in FIG. 50). In some embodiments, the etch release is a hydrofluoric acid (HF) vapor etch release. The vapor etch release also exposes the boss cap 164 (cap portion 510 in FIG. 50) and the boss protrusions 166 (silicon-filled etched portions 522 in FIG. 50). The boss cap 164 and the boss protrusions 166 encapsulate respective oxide portions 168 such that the oxide portions 168 remain after the HP vapor etch release process. The boss caps 164, the protrusions 166, and the encapsulated oxide portions 168 define respective boss structures 162 along the membrane 98.

By way of another example, a process for forming a pressure sensor such as the pressure sensor 180 of FIG. 5 is discussed below with reference to FIGS. 51-54. Initially, the processes described above with reference to FIGS. 23-29 are implemented to form a base layer 552, a lower oxide layer 554, a contact layer 556, a device layer 558 with a membrane 559, a nitride layer 560, and an upper oxide layer 562 as depicted in FIG. 51.

Figure 51:
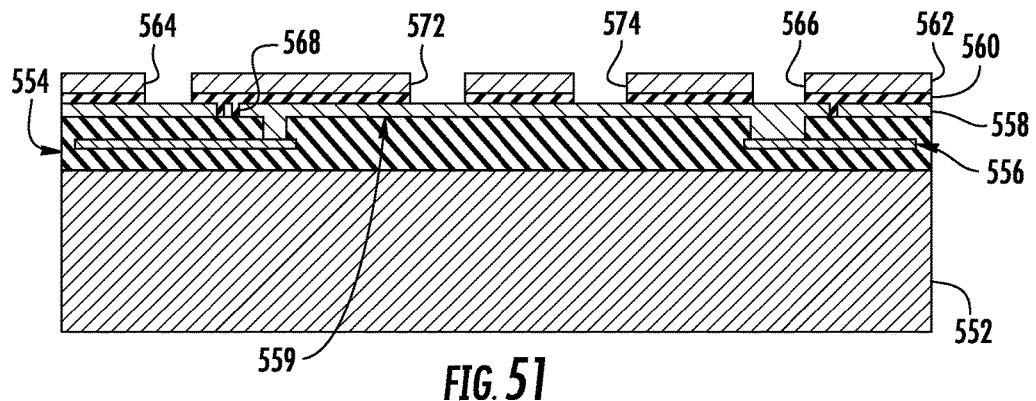

The upper oxide layer 562 and the nitride layer 560 are etched to form etched portions 564 and 566 to expose portions of the device layer 558 (FIG. 51). The etched portion 564 is formed leftward of a nitride-filled etched portion 568 in the device layer 558. The etched portion 566 is formed above a silicon-filled etched portion 570 in the lower oxide layer 554. In the embodiment shown, the upper oxide layer 426 and the nitride layer 424 are further etched to form etched portions 572 and 574 to expose another portion of the device layer 558. The etched portions 572 and 574 are formed between the etched portions 564 and 566 and located proximately, centrally above the membrane 559.

Figure 52:
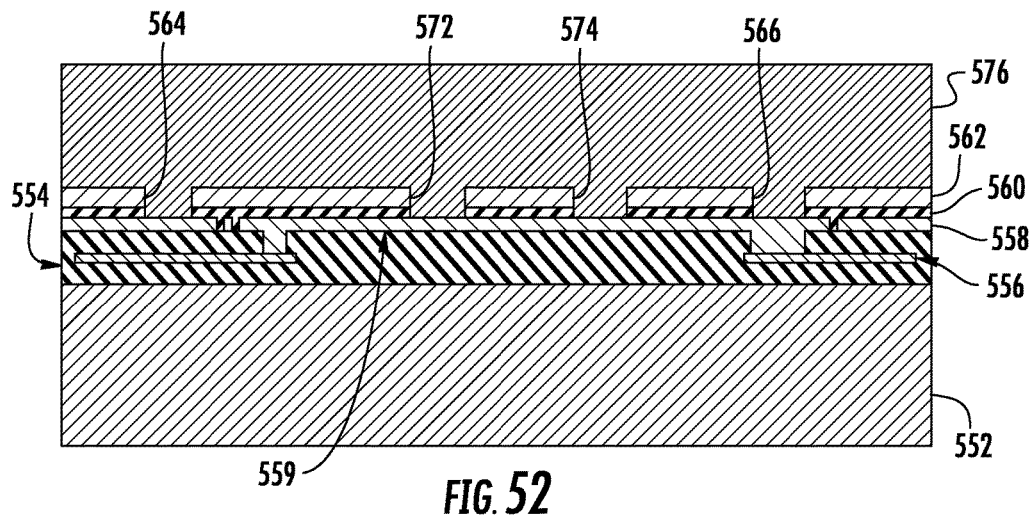

An epitaxial poly-silicon layer is then deposited above the etched upper oxide and nitride layers 562 and 560 and the exposed portions of the device layer 558 to form a backplate layer 576 (FIG. 52). The backplate layer 576 in the embodiment shown is deposited to a thickness of 5 to 50 µm. The deposition of the backplate layer 576 fills in the etched portions 564, 566, 572, and 574 with the poly silicon.

With reference now to FIG. 53, a plurality of vent holes or perforations 578 are etched through the backplate layer 576 to expose portions of the upper oxide layer 562. As shown in the figure, some of the vent holes are formed leftward of the silicon-filled etched portion 572, some of the vent holes are formed between the silicon-filled etched portions 572 and 574, and some of the vent holes are formed rightward of the silicon-filled etched portion 574. In the embodiment shown, the vent holes 576 are formed at least partially centrally above the membrane 559 defined in the device layer 558.

Referring now to FIG. 54, a timed vapor etch release is performed through the vent holes 578 which releases a portion of both the upper oxide layer 562 and the nitride layer 560 and exposes an upper surface 580 of the membrane 559. In some embodiments, the etch release is a hydrofluoric acid (HF) vapor etch release. In other embodiments, other etch release processes are implemented to etch the upper oxide layer 562 and the nitride layer 560. As shown in FIG. 54, the vapor etch release releases all of the upper oxide layer 562 and the nitride layer 560 between the silicon-filled etched portions 572 and 574 and between the silicon-filled etched portions 574 and 566. The vapor etch release releases a portion of the upper oxide layer 562 and the nitride layer 560 between the silicon-filled etch portions 564 and 572.

Referring again to FIG. 5, a backside trench 110 is then etched from portions of the base layer 82 (552 in FIG. 54) and the lower oxide layer 88 (554 in FIG. 54) to expose a lower surface 108 of the membrane 98 (559 in FIG. 54).

Figure 55:
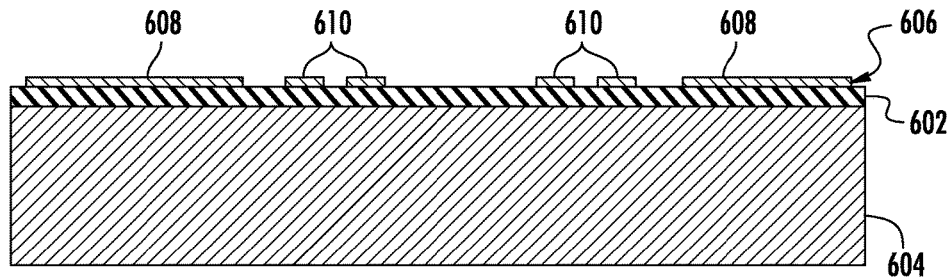
FIGS. 55-62 depict a modification of the process of FIGS. 23-33 for forming the pressure sensor of FIG. 6.

By way of yet another example, a process for forming a pressure sensor such as the pressure sensor 200 of FIG. 6 is discussed below with reference to FIGS. 55-62. Referring initially to FIG. 55, an oxide portion 602 is formed in a layer above a silicon base layer 604, and a layer of poly-silicon is deposited above the lower oxide portion 602 to form a contact layer 606. The contact layer 606 in the embodiment shown is deposited by LPCVD to a thickness of 0.3 to 2 µm. The contact layer 606 is then patterned to form an electrically conductive contact path 608 and a plurality of planar cap portions 610.

Figure 56:
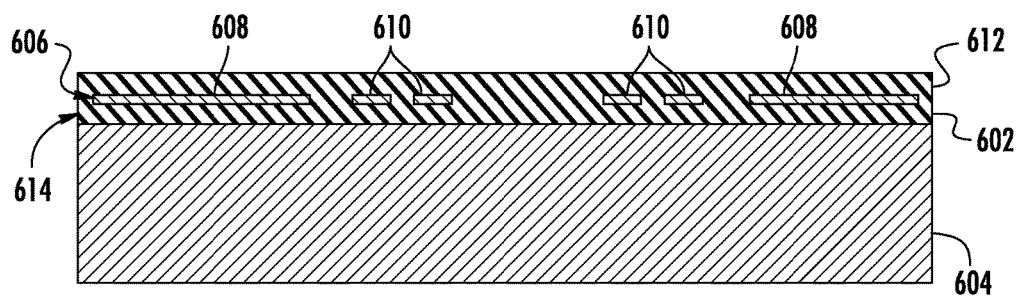
Figure 57:
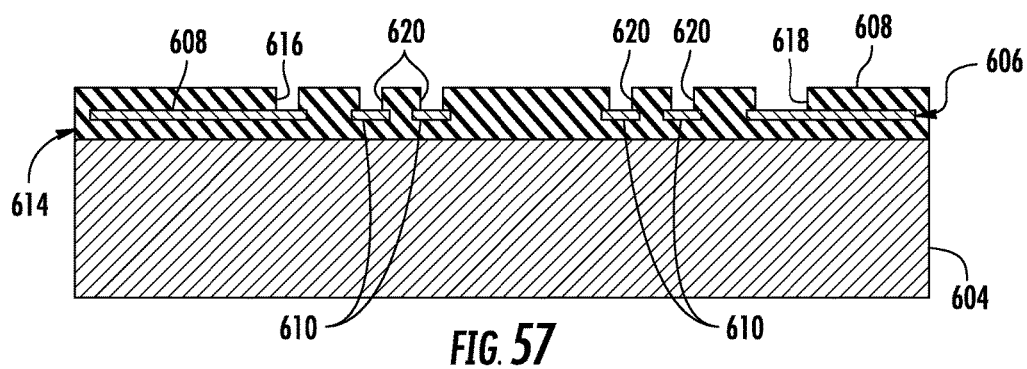

Referring now to FIG. 56, an oxide portion 612 is formed above the patterned contact layer 606 and the oxide portion 602. The oxide portions 602 and 612 form a lower oxide layer 614 that substantially encapsulates the contact path 608 and each of the cap portions 610. The lower oxide layer 614 is then etched to form etched portions 616 and 618 that expose respective portions of the contact path 608 (FIG. 57). The etching of the lower oxide layer 614 also forms a plurality of etched portions 620 that expose the respective cap portions 610.

Figure 58:
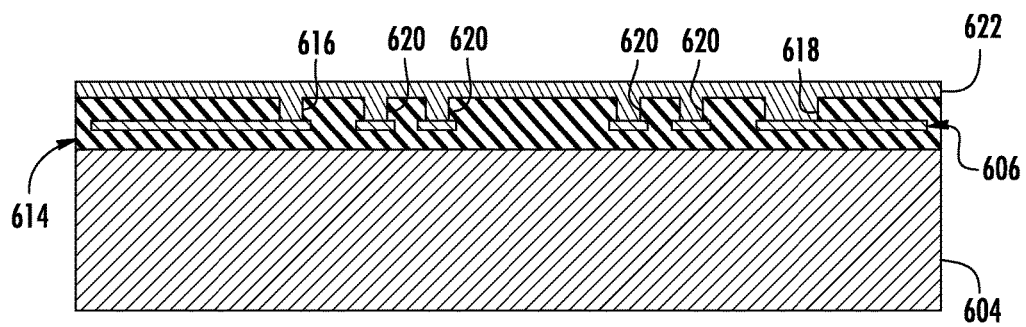

A layer of poly-silicon is then deposited above the etched lower oxide layer 614 to form a device layer 622 (FIG. 58). The device layer 622 in the embodiment shown is deposited to a thickness of 1 to 20 μm. In some embodiments, the poly-silicon is deposited by an LPCVD process, while in other embodiments the poly-silicon is deposited by an epitaxial process. The device layer 620 is in electrical communication with the contact path 608 through the silicon-filled etched portions 616 and 618 after the deposition of the device layer 620. The device layer 620 also contacts the cap portions 610 through the silicon-filled etched portions 620.

Figure 59:
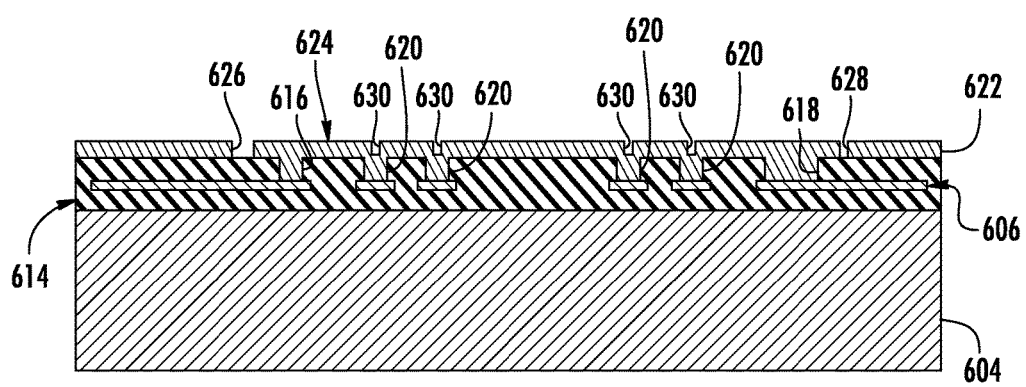
Figure 60:
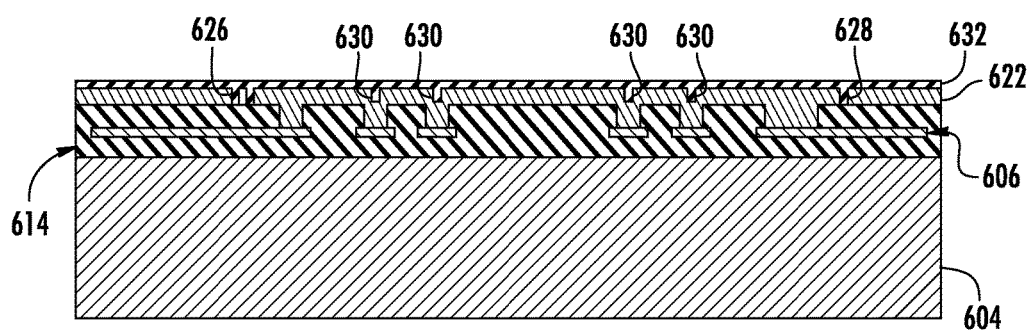

With reference now to FIG. 59, the device layer 620 is etched to define a membrane 624 between two etched portions 626 and 628. The etched portion 626 is etched into the device layer 620 leftward from the etched portion 616 as viewed in the figure, and the etched portion 628 is etched into the device layer 620 rightward from the etched portion 618 as viewed in the figure. The device layer 620 is further etched to form a respective etched portion 630 above each of the silicon-filled etched portions 620. A layer of silicon nitride [confirm material with inventors] is then deposited above the device layer 622 to form a nitride layer 632 (FIG. 60). The deposited silicon nitride at least partially fills the etched portions 626, 628, and 630.

Figure 61:
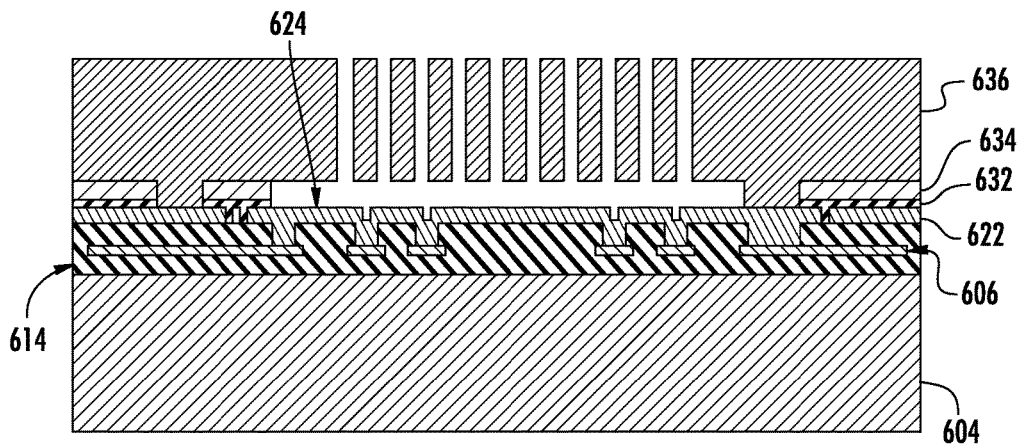

The processes described above with reference to FIGS. 29-33 are then implemented to form an upper oxide layer 634 and a backplate layer 636 as depicted in FIG. 61. A backside trench 638 is then etched through a portion of the base layer 604 to expose the lower oxide layer 614 (FIG. 62).

Figure 62:
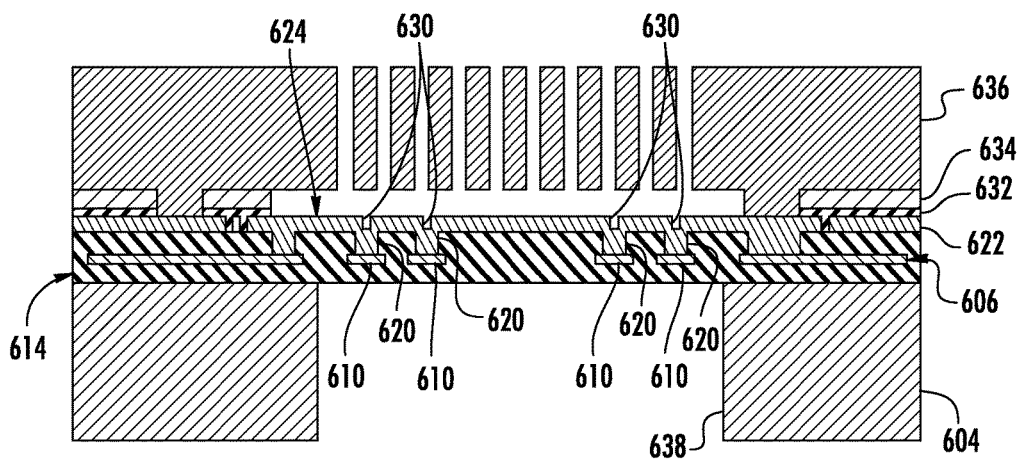

Referring now to FIG. 6, a timed vapor etch release is performed through the backside etched portion 110 (backside trench 638 in FIG. 62) which releases a portion of the lower oxide layer 88 (614 in FIG. 62) and exposes a lower surface 108 of the membrane 98 (624 in FIG. 62). In some embodiments, the etch release is a hydrofluoric acid (HF) vapor etch release. The vapor etch release also exposes the corrugation caps 204 (cap portion 610 in FIG. 62) and the protrusions 208 (silicon-filled etched portions 620 in FIG. 62), which along with the released etched portions 206 (etched portions 630 in FIG. 62), define the corrugations 202 in the membrane surfaces 104 and 108.

Figure 63:
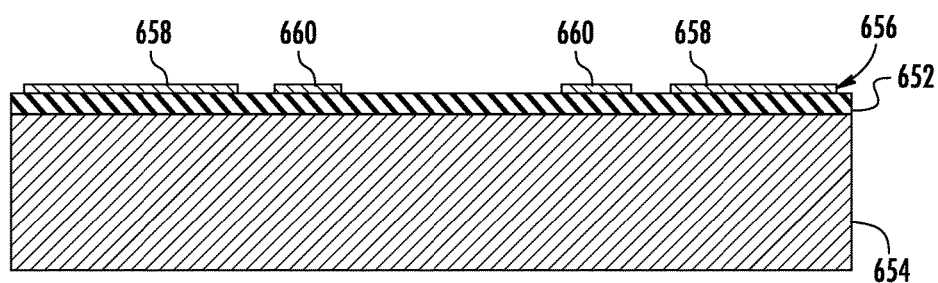
FIGS. 63-72 show a modification of the process of FIGS. 23-33 for forming the pressure sensor of FIG. 7.

By way of yet another example, a process for forming a pressure sensor such as the pressure sensor 220 of FIG. 7 is discussed below with reference to FIGS. 63-72. Referring initially to FIG. 63, an oxide portion 652 is formed in a layer above a silicon base layer 654, and a layer of poly-silicon is deposited above the lower oxide portion 652 to form a contact layer 656. The contact layer 656 in the embodiment shown is deposited by LPCVD to a thickness of 0.3 to 2 μm. The contact layer 656 is then patterned to form an electrically conductive contact path 658 and a plurality of planar cap portions 660.

Figure 64:
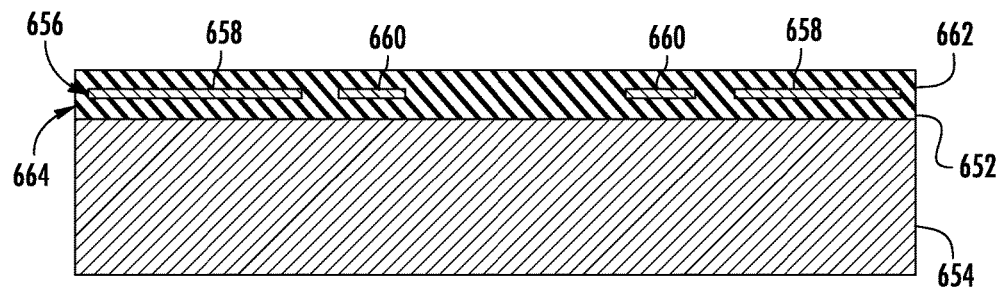
Figure 65:
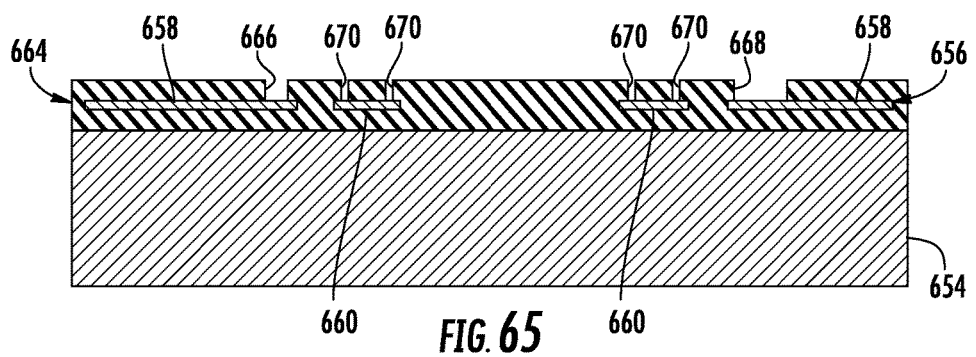

Referring now to FIG. 64, an oxide portion 662 is formed above the patterned contact layer 656 and the oxide portion 652. The oxide portions 652 and 662 form a lower oxide layer 664 that substantially encapsulates the contact path 658 and each of the cap portions 660. The lower oxide layer 664 is then etched to form etched portions 666 and 668 that expose respective portions of the contact path 658 (FIG. 65). The etching of the lower oxide layer 664 also forms a plurality of etched portions 670 with adjacent pairs of the etched portions 670 etched to expose the respective cap portions 660.

Figure 66:
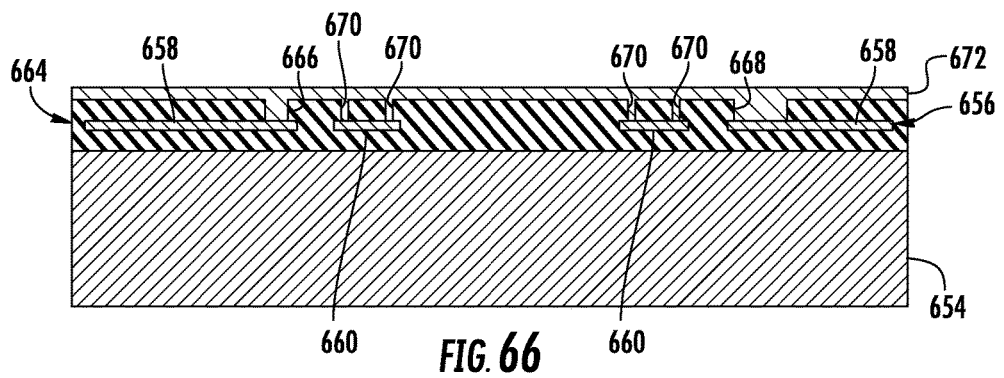

A layer of poly-silicon is then deposited above the etched lower oxide layer 664 to form a device layer 672 (FIG. 66). The device layer 672 in the embodiment shown is deposited by LPCVD to a thickness of 1 to 20 μm. In some embodiments, the poly-silicon is deposited by an LPCVD process, while in other embodiments the poly-silicon is deposited by an epitaxial process. The device layer 672 is in electrical communication with the contact path 658 through the silicon-filled etched portions 666 and 668 after the deposition of the device layer 672. The device layer 672 also contacts the cap portions 660 through the silicon-filled etched portions 670.

Figure 67:
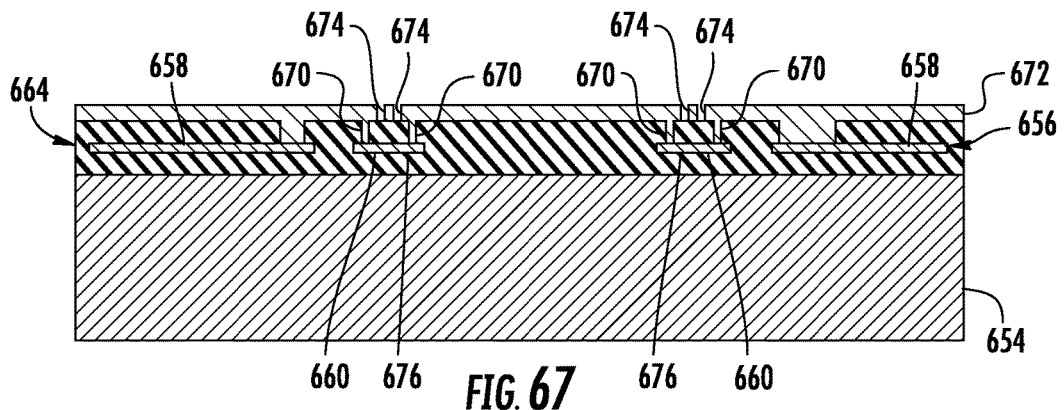
Figure 68:
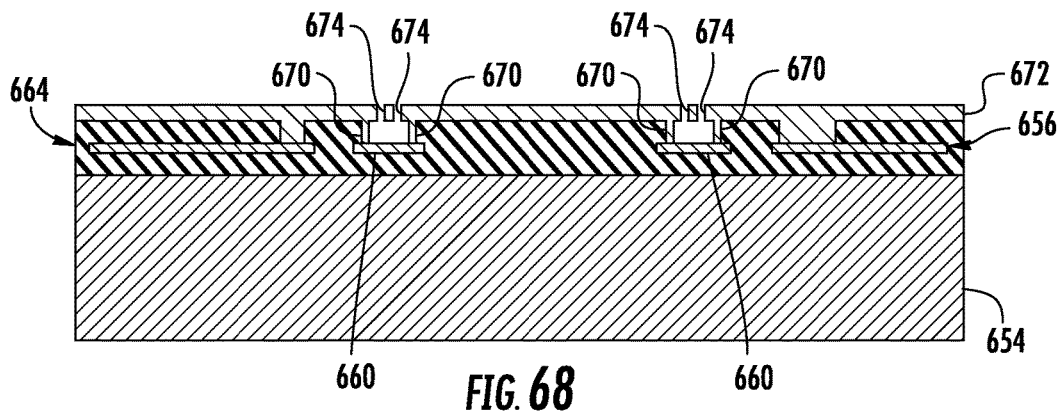
Figure 69:
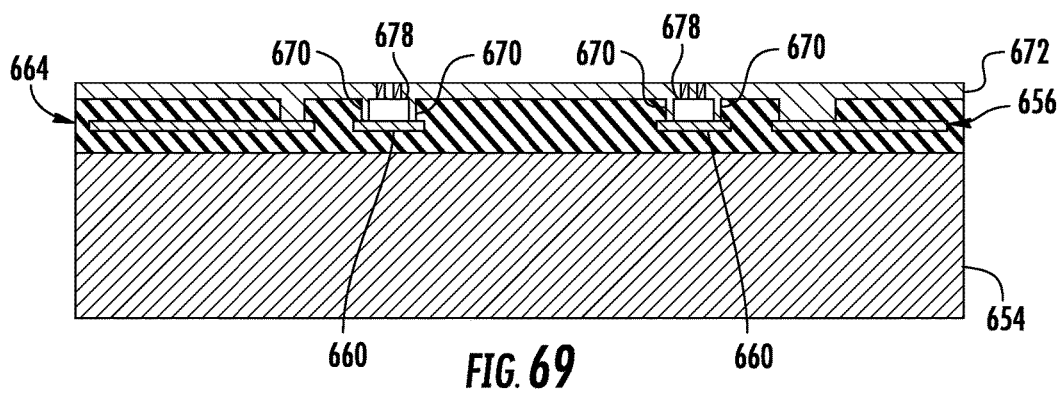

Referring now to FIG. 67, etched portions 674 are etched through the device layer 672 to expose respective releasable portions 676 of the lower oxide layer 664. As shown in the figure, the releasable oxide portions 676 are bounded by the cap portions 660, the silicon-filled etched portions 670, and the device layer 672. A vapor etch release is performed through the etched portions 674 which releases the releasable oxide portions 676 (FIG. 68). In some embodiments, the etch release is a hydrofluoric acid (HF) vapor etch release. The etched portions 674 are then sealed and form respective cavities 678 defined by the cap portions 660, the silicon-filled etched portions 670, and the device layer 672 (FIG. 69).

Figure 70:
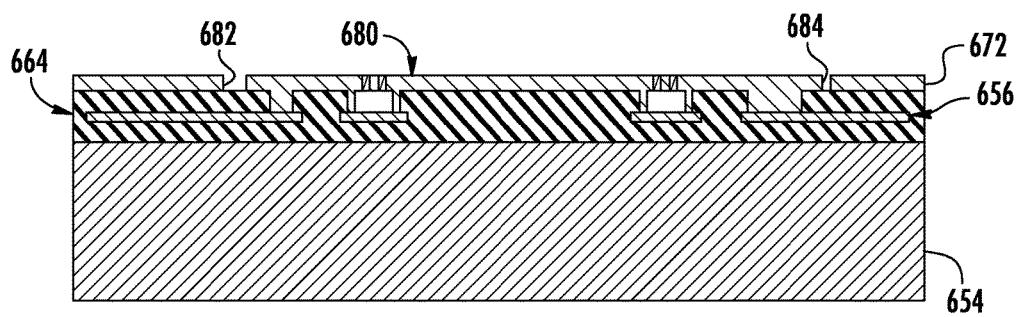

With reference now to FIG. 70, the device layer 672 is etched to define a membrane 680 between two etched portions 682 and 684. The etched portion 682 is etched into the device layer 672 leftward from the silicon-filled etched portion 666 as viewed in the figure, and the etched portion 684 is etched into the device layer 672 rightward from the silicon-filled etched portion 668 as viewed in the figure.

Figure 71:
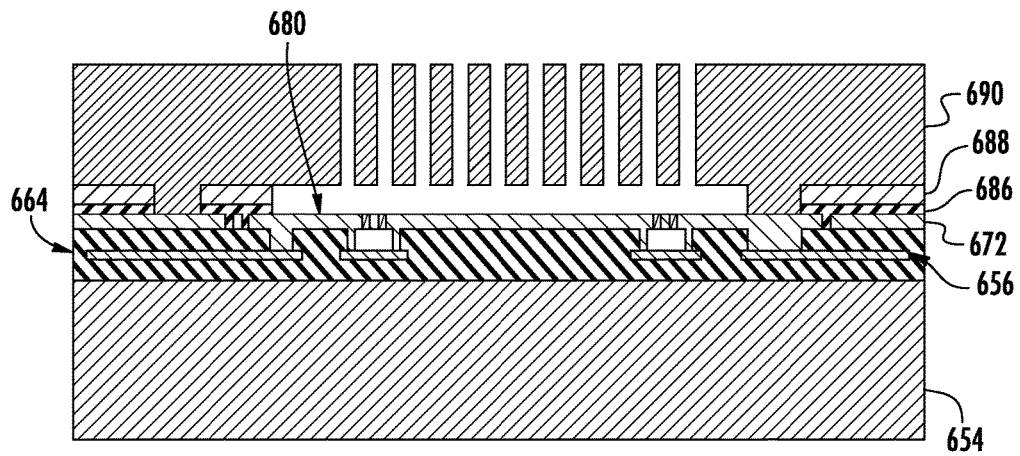

The processes described above with reference to FIGS. 28-33 are then implemented to form a nitride layer 686, an upper oxide layer 688, and a backplate layer 690 as depicted in FIG. 71. A backside trench 692 is then etched through a portion of the base layer 654 to expose the lower oxide layer 664 (FIG. 72).

Figure 72:
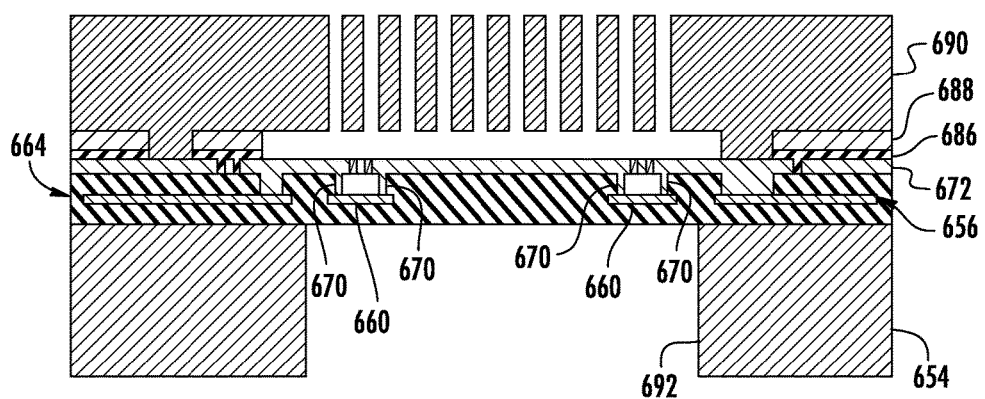

Referring now to FIG. 7, a timed vapor etch release is performed through the backside etched portion 110 (backside trench 692 in FIG. 72) which releases a portion of the lower oxide layer 88 (664 in FIG. 72) and exposes a lower surface 108 of the membrane 98 (680 in FIG. 72). In some embodiments, the etch release is a hydrofluoric acid (HF) vapor etch release. The vapor etch release also exposes the perforation caps 230 (cap portions 660 in FIG. 72) and the protrusions 226 (silicon-filled etched portions 670 in FIG. 72). The perforation caps 230 and the protrusions 226 define the respective sealed perforation structures 222 along the membrane 98.

Figure 73:
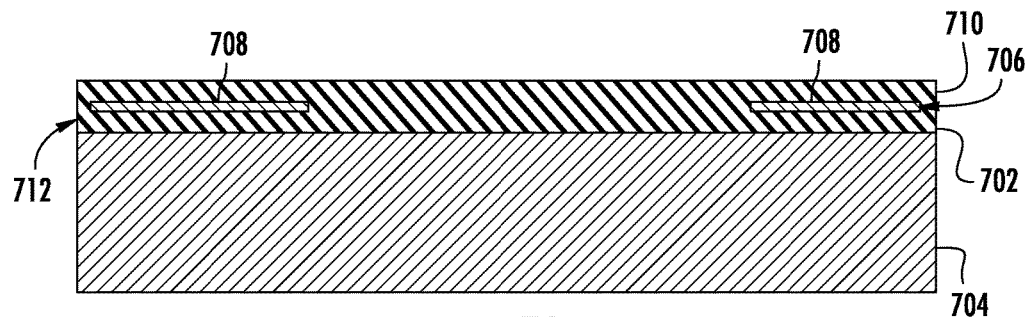
FIGS. 73-81 show a modification of the process of FIGS. 23-33 for forming the pressure sensor of FIG. 8.

By way of yet another example, a process for forming a pressure sensor such as the pressure sensor 240 of FIG. 8 is discussed below with reference to FIGS. 73-81. Referring initially to FIG. 73, an oxide portion 702 is formed in a layer above a silicon base layer 704, and a layer of poly-silicon is deposited above the oxide portion 702 to form a contact layer 706. The contact layer 706 in the embodiment shown is deposited by LPCVD to a thickness of 0.3 to 2 μm. The contact layer 706 is then patterned to form an electrically conductive contact path 708. An oxide portion 710 is formed above the patterned contact layer 706 and the oxide portion 702. The oxide portions 702 and 710 form a lower oxide layer 712 that substantially encapsulates the contact layer 706.

Figure 74:
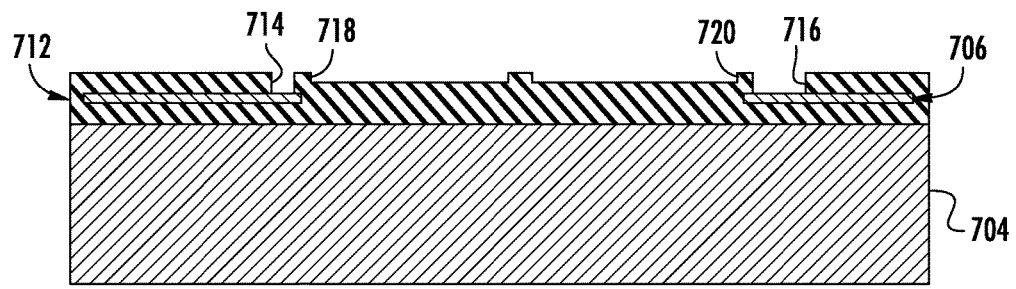

The lower oxide layer 712 is then etched to form etched portions 714 and 716 that expose respective portions of the contact layer 406 (FIG. 74). The etching of the lower oxide layer 712 also forms etched portions 718 and 720 which are spaced between etched portions 714 and 716.

Figure 75:
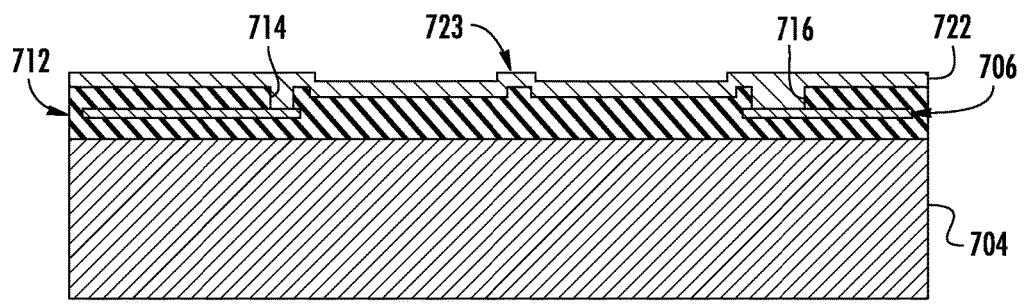

A layer of poly-silicon is then deposited above the etched lower oxide layer 712 to form a device layer 722 (FIG. 75). The device layer 722 in the embodiment shown is deposited to a thickness of 1 to 20 μm. In some embodiments, the poly-silicon is deposited by an LPCVD process, while in other embodiments the poly-silicon is deposited by an epitaxial process. The device layer 722 is in electrical communication with the contact layer 706 through the silicon-filled etched portions 714 and 716 after the deposition of the device layer 722. A central portion of the device layer 722 disposed above an unetched portion of the lower oxide layer between the etched portions 718 and 720 defines a membrane over-travel stop 723.

Figure 76:
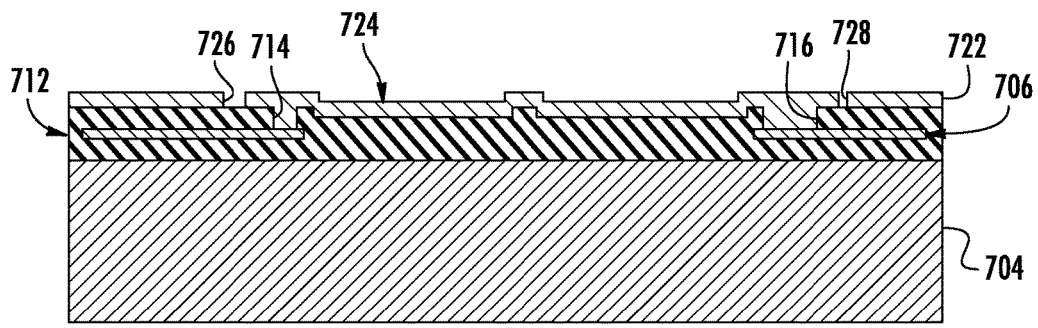

With reference now to FIG. 76, the device layer 722 is etched to define a membrane 724 between two etched portions 726 and 728. The etched portion 726 is etched into the device layer 722 leftward from the silicon-filled etched portion 714 as viewed in the figure, and the etched portion 728 is etched into the device layer 722 rightward from the silicon-filled etched portion 716 as viewed in the figure.

Figure 77:
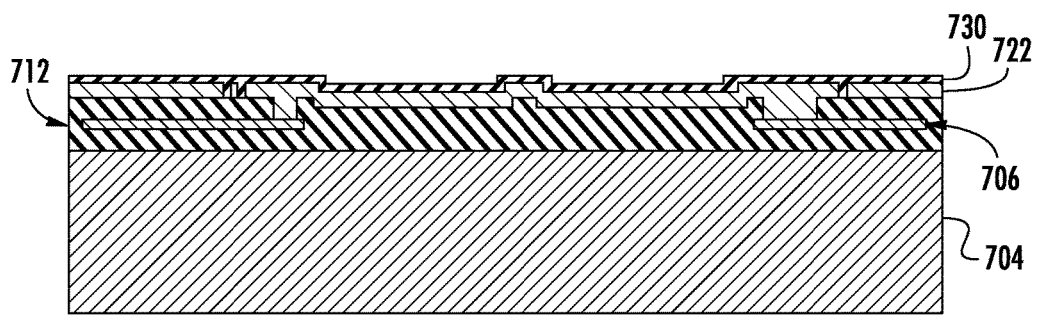
Figure 78:
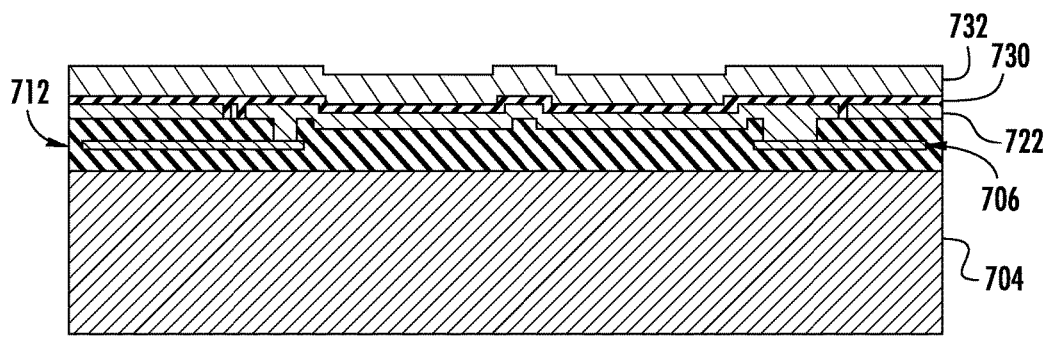
Figure 79:
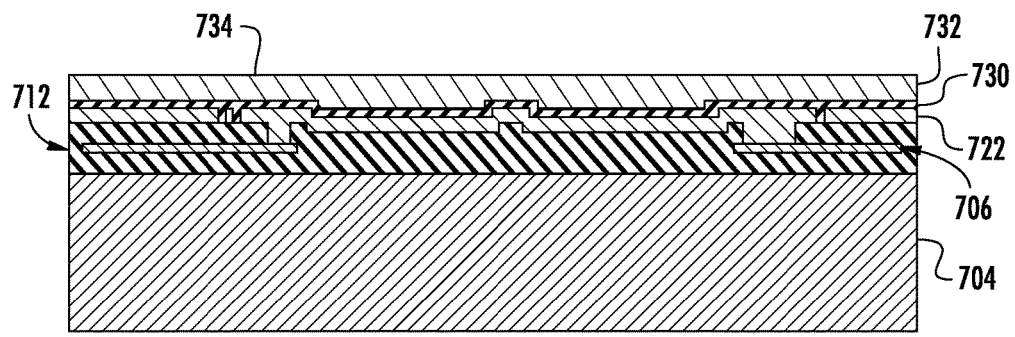

A layer of silicon nitride [confirm material with inventors] is then deposited above the device layer 722 to form a nitride layer 730 (FIG. 77). The deposited silicon nitride at least partially fills the etched portions 726 and 728 and further insulates the membrane 724 within the device layer 722. A layer of oxide is then formed above the nitride layer 730 to form an upper oxide layer 732 (FIG. 78). The upper oxide layer 732 is then planarized to form a planar upper surface 734 above the upper oxide layer 732.

Figure 80:
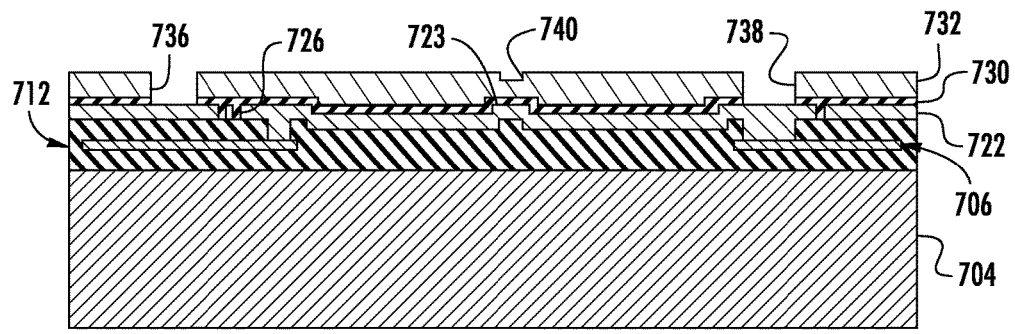

The upper oxide layer 732 and the nitride layer 730 are etched to form etched portions 736 and 738 which expose portions of the device layer 722 (FIG. 80). The etched portion 736 is formed leftward of the nitride-filled etched portion 726 in the device layer 722. The etched portion 738 is formed above the silicon-filled etched portion 716 below the device layer 722. In the embodiment shown, a portion of the upper oxide layer 732 is further etched to form an etched portion 740 located above the membrane over-travel stop 723.

Figure 81:
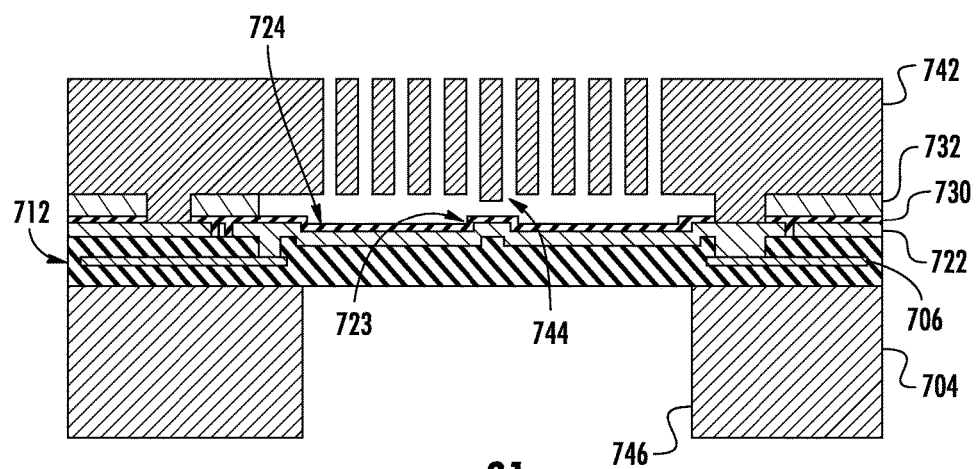

The processes described above with reference to FIGS. 31-33 are then implemented to form a backplate layer 742 as depicted in FIG. 81. The vapor etch release process (discussed with reference to FIG. 33) exposes the membrane over-travel stop 723 in the membrane 724 and exposes an opposing backplate layer over-travel stop 744 formed in the backplate layer 742. A backside trench 746 is then etched through a portion of the base layer 704 to expose the lower oxide layer 712.

Referring now to FIG. 8, a vapor etch release is performed through the backside etched portion 110 (backside trench 746 in FIG. 81) which releases a portion of the lower oxide layer 88 (712 in FIG. 81) and exposes the lower surface 108 of the membrane 98 (724 in FIG. 81). In some embodiments, the etch release is a hydrofluoric acid (HF) vapor etch release.

While the disclosure has been illustrated and described in detail in the drawings and foregoing description, the same should be considered as illustrative and not restrictive in character. It is understood that only the preferred embodiments have been presented and that all changes, modifications and further applications that come within the spirit of the disclosure are desired to be protected.

What is claimed is:

1. A capacitive micro electrical mechanical system (MEMS) pressure sensor, comprising:
    a base layer;
    a lower oxide layer supported by the base layer;
    a contact layer extending within the lower oxide layer;
    a membrane layer positioned generally above the lower oxide layer, the membrane layer including at least one protrusion extending downwardly through a portion of the lower oxide layer and contacting the contact layer;
    a nitride layer extending partially over the membrane layer;
    an upper oxide layer above the nitride layer;
    a backplate layer directly supported by the membrane layer and positioned above the upper oxide layer;
    a front-side etched portion exposing a first portion of the membrane layer through the upper oxide layer and the nitride layer; and
    a backside etched portion extending through the base layer, the backside etched portion at least partially aligned with the front-side etched portion.

2. The sensor of claim 1, further comprising:
    at least one nitride portion extending downwardly from the nitride layer through the membrane layer to the lower oxide layer, the at least one nitride portion enclosing the first portion of the membrane layer and a second portion of the membrane layer.

3. The sensor of claim 2, wherein the contact layer includes a shield portion which extends along a lower surface of the lower oxide portion at a location directly between the aligned backside etched portion and front-side etched portion, the shield portion contacting the base layer.

4. The sensor of claim 2, wherein the backside etched portion extends through the lower oxide layer exposing the second portion of the membrane layer.

5. The sensor of claim 4, wherein the contact layer extends outwardly away from the backside etched portion from the location at which the at least one protrusion contacts the contact layer to a location outwardly of a location directly beneath a first of the at least one nitride portions.

6. The sensor of claim 4, further comprising:
    at least one clamp portion extending downwardly from the backplate layer and contacting the mem brane layer at a location directly above an outward area of the second portion of the membrane layer thereby clamping the membrane layer.

7. The sensor of claim 4, further comprising:
    at least one boss supported by the membrane layer and encircled at one location by the front-side etched portion and encircled at another location by the backplate layer, wherein the at least one boss portion is formed out of the backplate layer.

8. The sensor of claim 4, further comprising:
    at least one boss extending downwardly from the membrane layer within the backside etched portion, the at least one boss including a sidewall formed with the membrane layer encircling a portion of the lower oxide layer, and a bottom portion encapsulating the portion of the lower oxide layer, the bottom portion formed from the contact layer.

9. The sensor of claim 4, further comprising:
    at least one corrugation extending downwardly from the membrane layer within the backside etched portion, the at least one corrugation encircling a portion of the membrane layer and including spaced apart sidewalls formed with the membrane layer and a bottom portion formed with the membrane layer, the bottom portion further including a planar corrugation cap on a lower surface of the bottom portion and formed from the contact layer.

10. The sensor of claim 4, further comprising at least one sealed perforated structure including a cavity defined by:
   a pair of opposed spaced apart sidewalls integrally formed with and extending downwardly from the membrane layer within the backside etched portion;
   a bottom portion formed from the contact layer; and
   at least one sealed etched portion of the membrane layer.

11. The sensor of claim 4, further comprising a dimple portion of the backplate layer, wherein:
   the backplate layer directly above the first portion of the membrane layer generally defines a first plane; and
   the dimple portion is directly above the first portion of the membrane layer and extends downwardly below the first plane.

12. The sensor of claim 11, wherein the dimple portion is electronically isolated from other portions of the backplate layer.

13. The sensor of claim 12, wherein the dimple portion is in electrical communication with the first portion of the membrane layer.

14. The sensor of claim 11, further comprising an over-travel stop, the over-travel stop:
   formed integrally with the membrane layer;
   aligned with the dimple portion; and
   extending upwardly from a plane generally defined by the membrane layer toward the dimple portion.

15. A method of forming a capacitive micro electrical mechanical system (MEMS) pressure sensor, comprising:
   forming a plurality of first contact layer portions on an first oxide layer portion supported by a base layer;
   encapsulating the plurality of first contact layer portions with the first oxide portion and a second oxide portion;
   etching the second oxide portion to expose a plurality of second contact layer portions of the plurality of first contact layer portions;
   forming a membrane layer on the plurality of second contact layer portions and on an upper surface of the second oxide portion;
   forming a nitride layer on an upper surface of the membrane layer;
   forming an upper oxide layer on an upper surface of the nitride layer;
   etching a first portion of the nitride layer and a first portion of the upper oxide layer to expose a first portion of the membrane layer;
   forming a backplate layer on the first portion of the membrane layer;
   front-side etching a second portion of the nitride layer and a second portion of the upper oxide layer through the backplate layer to expose a second portion of the membrane layer; and
   backside etching the base layer to form a cavity at least partially aligned with the second portion of the membrane layer.

16. The method of claim 15, wherein:
   the plurality of second contact layer portions are located closer to the cavity than a third contact layer portion of the first contact layer portions.

17. The method of claim 16, wherein backside etching the base layer comprises:
   backside etching the base layer such that a horizontally extending portion of at least one of the plurality of first contact layer portions is exposed.

18. The method of claim 16, wherein forming the membrane layer comprises:
   forming a pair of downwardly extending sidewalls such that when the base layer is backside etched, the pair of downwardly extending sidewalls extend into the cavity.

19. The method of claim 18, wherein forming the membrane layer further comprises:
   forming a bottom portion of a protrusion extending between the downwardly extending sidewalls and on one of the plurality of second contact layer portions.

20. The method of claim 16, wherein forming the backplate layer comprises:
   forming a dimple portion extending downwardly below a plane generally defined by a portion of the membrane layer, the dimple portion directly above the first portion of the membrane layer, the method further comprising:
   electronically isolating the dimple portion from other portions of the backplate layer; and
   placing the dimple portion in electronic communication with the first portion of the membrane layer.

* * * * *